US006749988B2

(12) United States Patent
Hatakeyama et al.

(10) Patent No.: US 6,749,988 B2
(45) Date of Patent: Jun. 15, 2004

(54) AMINE COMPOUNDS, RESIST COMPOSITIONS AND PATTERNING PROCESS

(75) Inventors: Jun Hatakeyama, Nakakubiki-gun (JP); Tomohiro Kobayashi, Nakakubiki-gun (JP); Takeru Watanabe, Nakakubiki-gun (JP); Takeshi Nagata, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 224 days.

(21) Appl. No.: 09/994,808

(22) Filed: Nov. 28, 2001

(65) Prior Publication Data

US 2002/0098443 A1 Jul. 25, 2002

(30) Foreign Application Priority Data

Nov. 29, 2000 (JP) ........................ 2000-362800

(51) Int. Cl.[7] ......................... G03C 1/73; G03F 7/038; G03F 7/039; G03F 7/20; G03F 7/30
(52) U.S. Cl. .................... 430/270.1; 430/325; 430/326; 430/327; 430/328; 430/330; 430/331; 430/296; 540/467; 540/480; 546/248; 546/339; 546/340; 546/341; 546/342; 546/344; 548/570; 548/571; 548/573; 548/574; 548/579; 548/950; 548/954; 548/968; 548/969; 548/215; 544/170; 544/171; 544/173; 544/174; 544/175; 544/177; 544/59; 544/60
(58) Field of Search ............................ 430/270.1, 296, 430/330, 311, 325, 326, 327, 328, 331; 540/450, 609, 596, 467, 480; 546/214, 246, 248, 339, 340, 341, 342, 344; 548/517, 570, 950, 954, 571, 573, 574, 579, 968, 969, 215; 544/170, 171, 173, 174, 175, 177, 59, 60

(56) References Cited

U.S. PATENT DOCUMENTS

| | | | |
|---|---|---|---|
| 4,093,615 A | * | 6/1978 | Ham et al. .................. 540/474 |
| 4,491,628 A | | 1/1985 | Ito et al. |
| 5,310,619 A | | 5/1994 | Crivello et al. |
| 5,580,695 A | | 12/1996 | Murata et al. |
| 5,609,989 A | | 3/1997 | Bantu et al. |

FOREIGN PATENT DOCUMENTS

| | | | |
|---|---|---|---|
| JP | 60-218642 | * | 11/1985 |
| JP | 63027829 A | | 5/1988 |
| JP | 90027660 B | | 6/1990 |
| JP | 5113666 A | | 5/1993 |
| JP | 5232706 A | | 9/1993 |
| JP | 5249683 A | | 9/1993 |
| JP | 63149640 A | | 6/1998 |
| WO | WO 9837458 A1 | | 8/1998 |

OTHER PUBLICATIONS

Chem. Abstract 105:105677—English Abstract for JP 60–218642—1985.*

Chem. Abstract 71:40136—English Abstract for JP43019115 B4—1968.*

Chem. Abstract 127:277891 (Remenar et al)—Abstract for "Lithium 2,2,6,6–Tetramethylpiperidide & Lithium 2,2,4,6, 6–Pentamethylpiperidide" Journal of Org. Chemistry, 62(17) pp. 5748–5754, 1997.*

Chem. Abstract 64:107193 (Bartoshevich et al)—Abstract for "Mutagenic Activity of N–substituted Ethylenimines", Antibiotiki, 10(12), pp. 1069–1078, 1965.*

Chem. Abstract 59:21591 (Tsou et al)—Abstract for "Synthesis of Possible Cancer Chemotherapeutic Compounds Based on Enzyme Approach IV. Aziridine derivatives" Journal of Medicinal Chemistry. 6(4) pp. 435–439, 1963.*

Hatakeyama, et al., "Investigation of Discrimination Enhancement with New Modeling for Poly–hydroxystyrene Positive Resists," *Journal of Photopolymer Science and Technology*, vol. 13, No. 4 (2000) pp 519–524.

Hinsberg et al., "Fundamental Studies of Airborne Chemical Contamination of Chemically Amplified Resists," *Journal of Photopolymer Science and Technology*, vol. 6, No. 4 (1993) pp 535–546.

Kumada, et al., "Study on Over–Top Coating of Positive Chemical Amplification Resists for KrF Excimer Laser Lithography," *Journal of Photopolymer Science and Technology*, vol. 6, No. 4 (1993) pp 571–574.

* cited by examiner

Primary Examiner—Mark F. Huff
Assistant Examiner—Sin J. Lee
(74) Attorney, Agent, or Firm—Millen, White, Zelano & Branigan, P.C.

(57) ABSTRACT

Novel amine compounds having a nitrogen-containing cyclic structure and a hydrating group such as a hydroxy, ether, ester, carbonyl, carbonate group or lactone ring are useful for use in resist compositions for preventing a resist film from thinning and also for enhancing the resolution and focus margin of resist.

20 Claims, No Drawings

AMINE COMPOUNDS, RESIST COMPOSITIONS AND PATTERNING PROCESS

BACKGROUND OF THE INVENTION

1. Field of the Invention

This invention relates to novel amine compounds useful as a basic component in resist compositions, novel resist compositions suitable for microfabrication comprising the amine compounds, and a patterning processing using the same.

Prior Art

While a number of efforts are currently made to achieve a finer pattern rule in the drive for higher integration and operating speeds in LSI devices, deep-ultraviolet lithography is thought to hold particular promise as the next generation in microfabrication technology. Deep-UV lithography is capable of pattern generation to dimensions of 0.2 μm or less and, when a resist material having low light absorption is used, can form patterns with sidewalls that are nearly vertical to the substrate. One technology that has attracted a good deal of attention recently utilizes a high-intensity KrF excimer laser as the deep-UV light source. Resist materials with low light absorption and high sensitivity are needed to successfully apply this technology to large-volume production.

In light of this, acid-catalyzed chemically amplified positive resist materials were recently developed as disclosed in JP-B 2-27660, JP-A 63-27829, U.S. Pat. Nos. 4,491,628 and 5,310,619. Because of their excellent properties including sensitivity, resolution and dry-etching resistance, they are especially promising as resist materials for deep-UV lithography.

Chemically amplified resist materials; however, suffer from a post-exposure delay (PED) problem and a footing phenomenon. The PED problem is that in lithographic process, line patterns would have a T-top profile, that is, patterns become thick at the top if the leave-to-stand or delay time from exposure to post-exposure baking (PEB) is extended. The footing is a phenomenon that a pattern on a basic substrate, especially silicon nitride or titanium nitride substrate becomes widened in proximity to the substrate. It is believed that the T-top profile arises because the solubility of resist film is reduced in proximity to its lo surface whereas the footing arises because the solubility of resist film is reduced in proximity to the substrate. There also occurs a problem that dark reaction of eliminating acid labile groups proceeds in a PED duration from exposure to PEB, reducing the dimension of lines to be left. These problems are serious enough to prevent chemically amplified positive resist materials from practical application. Moreover, these problems not only complicate dimensional control in the lithographic process, but also adversely affect dimensional control in the processing of substrates using dry etching. In this regard, reference is made to W. Hinsberg et al., J. Photopolym. Sci. Technol., 6 (4), 535–546 (1993) and T. Kumada et al., J. Photopolym., Sci. Technol., 6 (4), 571–574 (1993). It is understood that in chemically amplified positive resist materials, air-borne basic compounds largely participate in the PED problem and basic compounds on the substrate surface largely participate in the footing phenomenon. Light exposure generates acid at the resist surface which is deactivated through reaction with air-borne basic compounds. As the leave-to-stand or delay time from exposure to PEB is extended, the amount of thus deactivated acid increases to retard decomposition of acid labile groups. An insolubilized layer is then formed at the resist surface, resulting in a T-top profile.

It is well known that the addition of basic compounds to resist materials is effective to suppress the influence of air-borne basic compounds, thereby improving PED (see U.S. Pat. No. 5,609,989, WO 98/37458, JP-A 63-149640, JP-A 5-113666, JP-A 5-232706 and JP-A 5-249683). Among such basic compounds, nitrogenous compounds are well known, typically amine and amide compounds having a boiling point of 150° C. or higher. Illustrative examples include pyridine, polyvinyl pyridine, aniline, N-methylaniline, N,N-dimethylaniline, o-toluidine, m-toluidine, p-toluidine, 2,4-lutidine, quinoline, isoquinoline, formamide, N-methylformamide, N,N-dimethyl-formamide, acetamide, N-methylacetamide, N,N-dimethylacet-amide, 2-pyrrolidone, N-methylpyrrolidone, imidazole, α-picoline, β-picoline, γ-picoline, o-aminobenzoic acid, m-aminobenzoic acid, p-aminobenzoic acid, 1,2-phenylenediamine, 1,3-phenylenediamine, 1,4-phenylenediamine, 2-quinolinecarboxylic acid, 2-amino-4-nitrophenol, and triazine compounds such as 2-(p-chlorophenyl)-4,6-trichloromethyl-s-triazine. Of these, pyrrolidone, N-methylpyrrolidone, o-aminobenzoic acid, m-aminobenzoic acid, p-aminobenzoic acid and 1,2-phenylenediamine are often used.

These nitrogenous compounds are weakly basic and can mitigate the T-top problem, but fail to control reaction or acid diffusion when highly reactive acid labile groups are used. The addition of weak bases allows the dark reaction during PED to proceed to unexposed areas, incurring sliming of line size and film thinning on line surface during PED. This problem may be overcome by adding strong bases. However, a higher basicity does not always bring good results. No satisfactory results are obtained when proton sponge, DBN, and DBU, which are known as a ultra-strong base and shown below, or quaternary amines such as tetramethylammonium hydroxide are added.

Proton Sponge

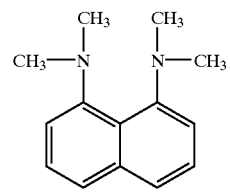

DBN: 1,5-diazabicyclo[4.3.0]-5-nonene

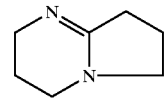

DBU: 1,8-diazabicyclo[5.4.0]-7-undecene

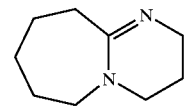

To enhance contrast to achieve a high resolution, it is advantageous to add a base which is more effective for complementing the acid generated. While the dissociation constant of an acid or base in water is accounted for in terms of pKa, the ability of a base to complement acid in the resist film is not directly related to the pKa of the if base. This fact is discussed in Hatakeyama et al., J. of Photopolymer Sci. and Technology, Vol. 13, No. 4, pp. 519–524 (2000).

SUMMARY OF THE INVENTION

An object of the invention is to provide a novel amine compound which is effective for preventing a resist film from thinning and for expanding the focus margin while achieving an improved resolution. Another object is to provide a resist composition comprising the same and a patterning process using the composition.

The present inventor has found that amine compounds having the following general formula (1), (2), (3) or (4), that is, amine compounds having a hydrating group such as a hydroxy, ether, ester, carbonyl, carbonate group or lactone ring and a cyclic structure are most effective for preventing a resist film from thinning and also effective for enhancing the resolution and focus margin of resist.

In a first aspect, the invention provides amine compounds as defined below.

One embodiment embraces amine compounds of the following general formula (1):

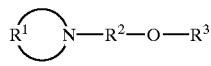

(1)

wherein $R^1$ is a straight or branched alkylene group of 2 to 20 carbon atoms which may contain at least one carbonyl, ether, ester or sulfide group, $R^2$ is a straight or branched alkylene group of 1 to 10 carbon atoms, $R^3$ is a straight, branched or cyclic alkyl or alkoxy group of 1 to 20 carbon atoms which may contain a hydroxy group, ether group, carbonyl group, ester group, lactone ring or carbonate group, and $R^2$ and $R^3$, taken together, may form a ring with the oxygen atom.

A second embodiment embraces amine compounds of the following general formula (2):

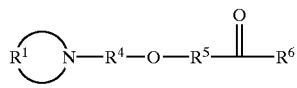

(2)

wherein $R^1$ is a straight or branched alkylene group of 2 to 20 carbon atoms which may contain at least one carbonyl, ether, ester or sulfide group, $R^4$ is a straight or branched alkylene group of 1 to 10 carbon atoms, $R^5$ is a single bond or a straight, branched or cyclic alkylene group of 1 to 20 carbon atoms, and $R^6$ is hydrogen or a straight, branched or cyclic alkyl or alkoxy group of 1 to 20 carbon atoms which may contain a hydroxy group, ether group, carbonyl group, ester group, lactone ring or carbonate group.

A third embodiment embraces amine compounds of the following general formula (3):

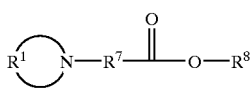

(3)

wherein $R^1$ is a straight or branched alkylene group of 2 to 20 carbon atoms which may contain at least one carbonyl, ether, ester or sulfide group, $R^7$ is a straight or branched alkylene group of 1 to 10 carbon atoms, $R^6$ is a straight, branched or cyclic alkyl group of 1 to 20 carbon atoms which may contain a hydroxy group, ether group, carbonyl group, ester group, lactone ring or carbonate group, and $R^7$ and $R^8$, taken together, may form a ring with the COO.

A fourth embodiment embraces amine compounds of the following general formula (4):

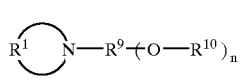

(4)

wherein $R^1$ is a straight or branched alkylene group of 2 to 20 carbon atoms which may contain at least one carbonyl, ether, ester or sulfide group, $R^1$ is a (n+1)-valent organic group of 2 to 10 carbon atoms, $R^{10}$ which may be the same or different is hydrogen or a straight, branched or cyclic alkyl or alkoxy group of 1 to 20 carbon atoms which may contain a hydroxy group, ether group, carbonyl group, ester group, lactone ring or carbonate group, and n is equal to 2, 3 or 4.

In a second aspect, the invention provides a resist composition comprising at least one of amine compounds of the general formulae (1) to (4) defined above.

The resist composition is typically a positive resist composition comprising (A) the amine compound defined above, (B) an organic solvent, (C) a base resin having an acidic functional group protected with an acid labile group, which is normally alkali,insoluble or substantially alkali insoluble, but becomes alkali soluble upon elimination of the acid labile group, and (D) a photoacid generator. The positive resist composition may further comprise (E) a dissolution inhibitor.

Alternatively, the resist composition is a negative resist composition comprising (A) the amine compound defined above, (B) an organic solvent, (C') a base resin which is normally alkali-soluble, but becomes substantially alkali insoluble when crosslinked with a crosslinker, (D) a photoacid generator, and (F) the crosslinker capable of crosslinking under the action of acid.

In a third aspect, the invention provides a process for forming a resist pattern comprising the steps of applying the resist composition defined above onto a substrate to form a coating; heat treating the coating and then exposing it to high-energy radiation having a wavelength of less than 300 nm or electron beams through a photo mask; and optionally heat treating the exposed coating and developing it with a developer.

DESCRIPTION OF THE PREFERRED EMBODIMENTS

Amine Compound

The amine compounds of the invention have the following general formulae (1), (2), (3) and (4).

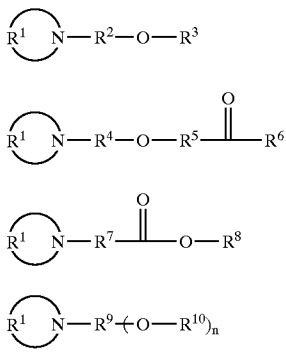

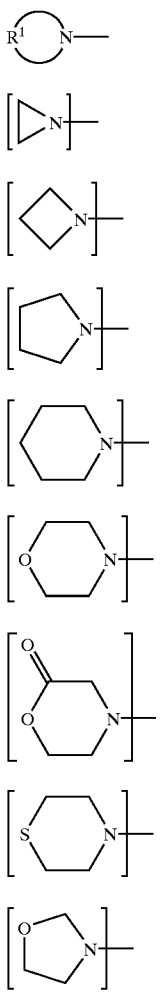

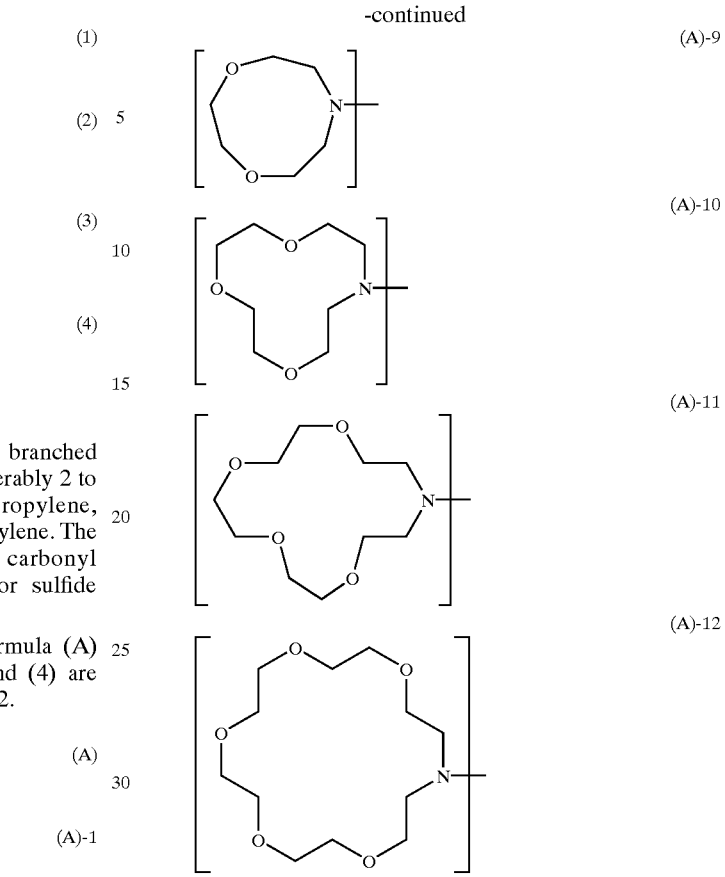

In formulae (1) to (4), $R^1$ is a straight or branched alkylene group of 2 to 20 carbon atoms, and preferably 2 to 18 carbon atoms, for example, ethylene, propylene, butylene, hexylene, octylene, decylene, and dodecylene. The alkylene group may contain one or more carbonyl (=C=O), ether (—O—), ester (—COO—) or sulfide (—S—) groups.

Illustrative of the group of the following formula (A) included in the above formulae (1), (2), (3) and (4) are groups of the following formulae (A)-1 to (A)-12.

In formulae (1) to (4), $R^2$, $R^4$ and $R^7$ each are a straight or branched alkylene group of 1 to 10 carbon atoms, for example, methylene, ethylene, propylene, and butylene.

$R^3$ and $R^6$ each are hydrogen or a straight, branched or cyclic alkyl or alkoxy group of 1 to 20 carbon atoms and preferably 1 to 10 carbon atoms. Examples include hydrogen, alkyl groups such as methyl, ethyl, propyl, isopropyl, n-butyl, isobutyl, tert-butyl, pentyl, cyclopentyl, hexyl, cyclohexyl, octyl, decyl and dodecyl, and alkoxy groups having the foregoing alkyl groups. These alkyl and alkoxy groups may contain one or more hydroxy groups, ether groups, carbonyl groups, ester groups, lactone rings or carbonate groups.

$R^5$ is a single bond or a straight, branched or cyclic alkylene group of 1 to 20 carbon atoms, and preferably 1 to 10 carbon atoms, examples of which correspond to the above-exemplified alkyl groups, with one hydrogen atom being eliminated.

$R^8$ is a straight, branched or cyclic alkyl group of 1 to 20 carbon atoms and preferably 1 to 16 carbon atoms, examples of which are the same as the above-exemplified alkyl groups. The alkyl group may contain one or more hydroxy groups, ether groups, carbonyl groups, ester groups, lactone rings or carbonate groups.

It is noted that $R^7$ and $R^8$, taken together, may form a ring. In this event, $R^8$ is a divalent group obtained by eliminating one hydrogen atom (attached to a carbon atom) from the above-defined group.

$R^9$ is a (n+1)-valent organic group of 2 to 10 carbon atoms, wherein n is equal to 2, 3 or 4. Then $R^9$ is a tri-, tetra- or penta-valent organic group. Illustrative are the hydrocarbon groups given below.

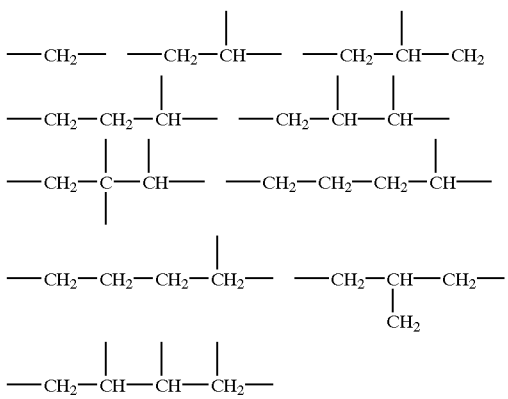

$R^{10}$ which may be the same or different is hydrogen or a straight, branched or cyclic alkyl or alkoxy group of 1 to 20 carbon atoms which may contain a hydroxy group, ether group, carbonyl group, ester group, lactone ring or carbonate group. The alkyl and alkoxy groups represented by $R^{10}$ are the same as the above-exemplified ones.

The group which is directly attached to the nitrogen atom in the above formulae (1), (2), (3) and (4) is of the following formulae (B1), (B2), (B3) and (B4), respectively, illustrative examples of which are groups of the following formulae (B1)-1 to (B1)-7, (B2)-1 to (B2)-13, (B3)-1 to (B3)-23, and (B4)-1 to (B4)-5.

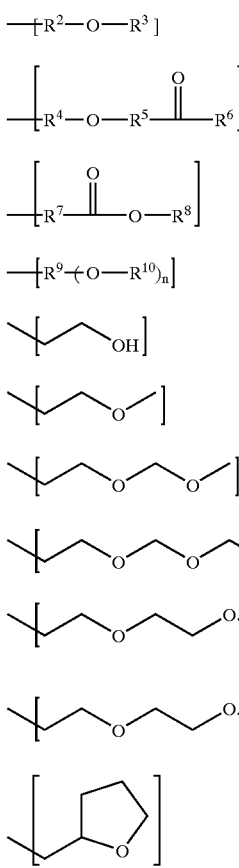

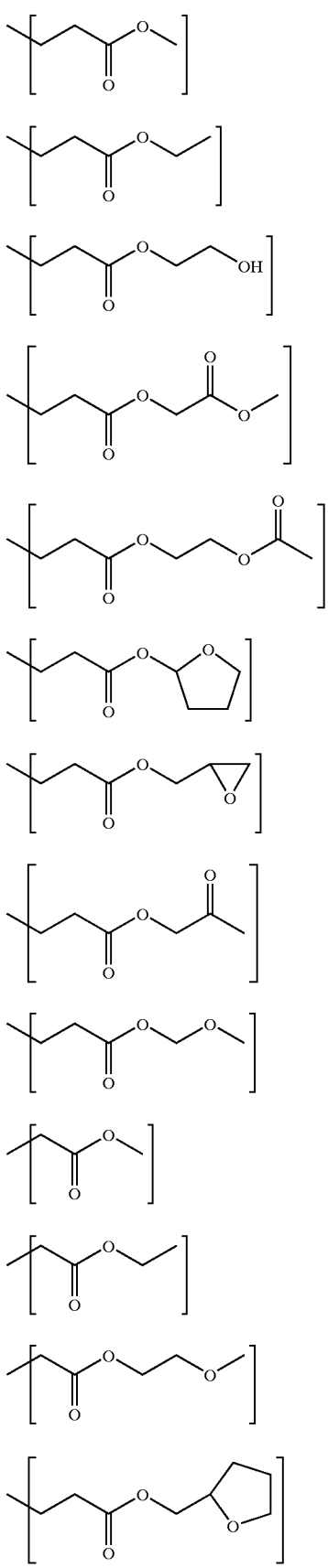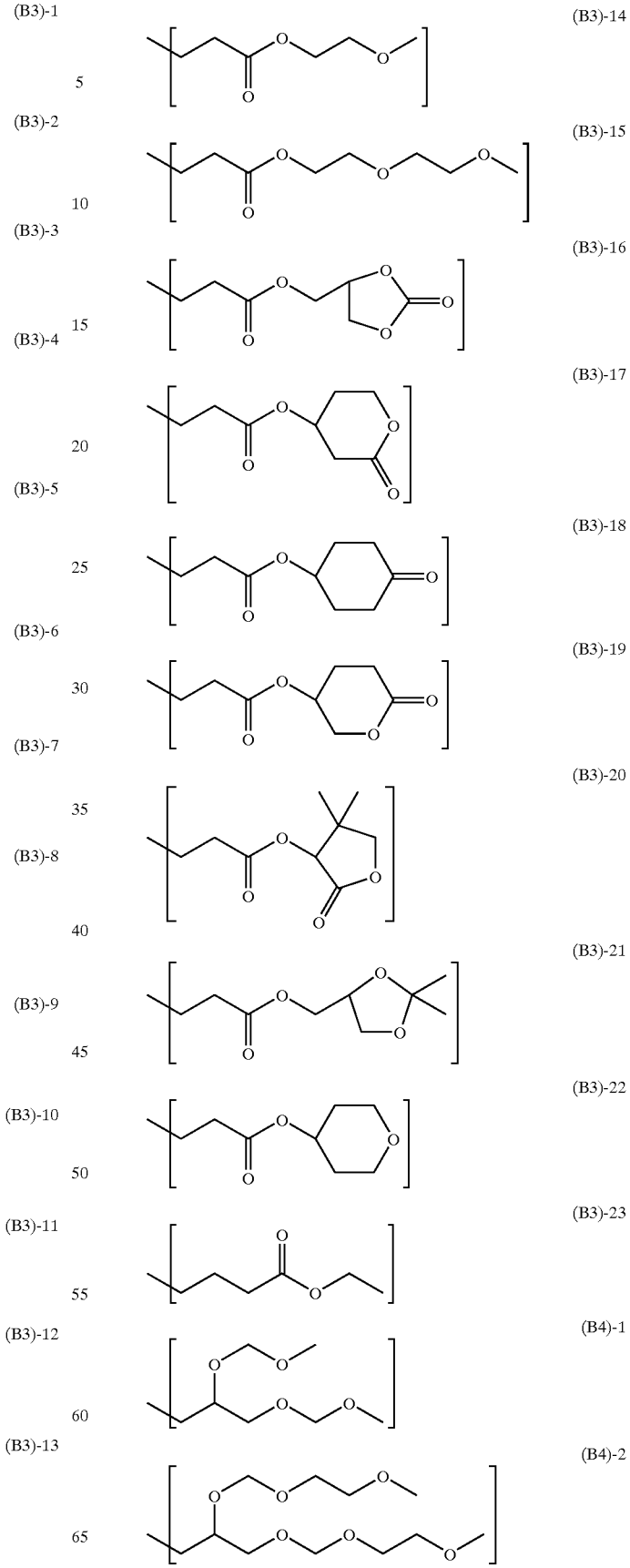

-continued

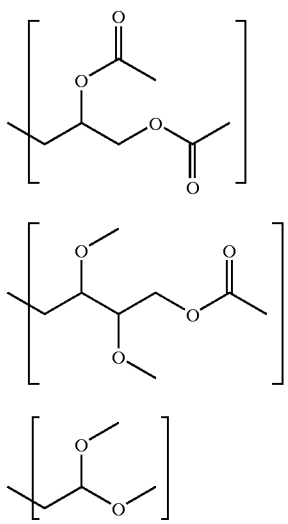

(B4)-3

(B4)-4

(B4)-5

The amine compounds of formulae (1), (2),:(3) and (4) can be prepared by an appropriate method which is selected from several available methods depending on the structure of particular compound although the method is not limited thereto. Several exemplary methods are described below in detail.

A first method is by O-alkylation or O-acylation of an amino-alcohol compound having a cyclic amine structure. This method is especially suited for the preparation of the inventive amine compounds of formula (1), (2) and (4). In the case of O-alkylation, exemplary O-alkylating reagents include, though are not limited thereto, methyl iodide, butyl bromide, dimethyl sulfate, ethyl iodide, diethyl sulfate, methoxymethyl chloride, (2-methoxyethoxy)methyl chloride, methyl chloroacetate, and chloroacetone. In the case of O-acylation, exemplary O-acylating reagents include, though are not limited thereto, formic acid, mixed formic acid/acetic acid anhydride, acetic anhydride, acetic chloride, propionic anhydride, propionic chloride, butyric chloride, isobutyric chloride, valeric chloride, pivalic chloride, methoxyacetic chloride, acetoxyacetic chloride, di-t-butyl pyrocarboxylate, phenyl acetate, p-nitrophenyl acetate, and 2,4,6-trichlorophenyl acetate. An appropriate amount of the O-alkylating or O-acylating reagent used is 0.5 to 5.0 mol and especially 1.0 to 2.5 mol per mol of hydroxyl group in the amino-alcohol compound. Reaction is carried out in the presence or absence of solvent. The solvents which can be used herein include hydrocarbon solvents such as hexane, heptane, benzene, toluene, and xylene, ethers such as diethyl ether, dibutyl ether, tetrahydrofuran, 1,4-dioxane and diglyme, chlorinated solvents such as methylene chloride, chloroform and 1,2-dichloroethylene, aprotic polar solvents such as N,N-dimethylformamide, N,N-dimethylacetamide, dimethyl sulfoxide and N-methylpyrrolidone, carboxylic acids such as formic acid and acetic acid, esters such as ethyl acetate and butyl acetate, ketones such as acetone and 2-butanone, nitriles such as acetonitrile, and amines such as pyridine and triethylamine. Any appropriate one or mixture may be selected from these solvents depending on the reaction conditions. A basic compound may be added to promote the reaction. Illustrative, non-limiting examples of useful basic compounds include salts of alkali or alkaline earth metals such as sodium hydroxide, potassium hydroxide, potassium carbonate, sodium carbonate, sodium bicarbonate, sodium hydride, calcium hydride, potassium t-butoxide and lithium t-butoxide; organometallic compounds such as n-butyl lithium, lithium diisopropylamide, lithium hexamethyldisilazide and bromomagnesium diisopropylamide; and organic amines such as pyridine, triethylamine, diisopropylethyl-amine, N,N-dimethylaniline and 4-dimethylaminopyridine. The basic compounds may be used alone or in admixture of any. An appropriate amount of the basic compound used is 0.8 to 10 mol and especially 0.9 to 3.0 mol per mol of the O-alkylating or O-acylating reagent. In the case of O-alkylation, a catalyst may be added to accelerate the reaction, for example, sodium iodide or tetrabutylammonium iodide. The reaction temperature may be selected in the range from −70° C. to the reflux temperature of the solvent and preferably in the range of 0° C. to 50° C. From the yield standpoint, the reaction is desirably continued to completion while monitoring the reaction by gas chromatography (GC) or thin layer chromatography (TLC), although the reaction time is usually about 0.2 to about 20 hours. From the reaction mixture, the end amine compound is obtained by a conventional aqueous work-up step. If necessary, the end amine compound is purified by any conventional technique such as distillation, chromatography or recrystallization.

As a second method, conversion like the O-acylation reaction noted in the first method is carried out by transesterification reaction between an amino-alcohol compound having a cyclic amine structure and a carboxylate in the presence of a catalyst.

This method starts with an amino-alcohol compound and carries out transesterification reaction with a carboxylate ($R^1CO_2R^2$) in the presence of a catalyst to give the end compound. The reaction is carried out in the presence or absence of solvent. It is desirable for improving the yield of the end compound and reducing the reaction time that the reaction be carried out while removing the alcohol ($R^2OH$) which is newly formed by the reaction. Illustrative, non-limiting examples of the carboxylate used herein include methyl formate, ethyl formate, methyl acetate, ethyl acetate, methyl propionate, methyl butyrate, methyl valerate, methyl pivalate, methyl cyclohexanecarboxylate, methyl methoxyacetate, methyl ethoxyacetate, methyl 2-methoxyethoxyacetate and methyl 2-(2-methoxyethoxy) ethoxy-acetate. An appropriate amount of the carboxylate used is 0.5 to 5.0 mol and especially 1.0 to 2.0 mol per mol of the starting amino-alcohol compound. Illustrative, non-limiting examples of the transesterification catalyst include organic amines such as triethylamine, 1,8-diazabicyclo [5.4.0]-7-undecene and 4-dimethylaminopyridine; inorganic bases such as sodium hydroxide, potassium carbonate and sodium carbonate; metal alkoxides such as sodium methoxide, potassium t-butoxide, magnesium ethoxide and titanium(IV) methoxide; salts such as iron(III) sulfate and calcium chloride: and inorganic or organic acids such as hydrogen chloride, sulfuric acid and p-toluenesulfonic acid. An appropriate amount of the transesterification catalyst used is 0.001 to 5.0 mol and especially 0.001 to 0.1 mol per mol of the starting amino-alcohol compound. Exemplary solvents include ethers such as tetrahydrofuran, di-n-butyl ether and 1,4-dioxane, hydrocarbons such as n-hexane, n-heptane, benzene, toluene, xylene and cumene, and chlorinated solvents such as chloroform and dichloroethylene, which may be used alone or in admixture of any. The reaction temperature varies with reaction conditions and preferably ranges from 50° C. to 200° C. Most preferably, reaction is carried out at a temperature near the boiling point of the reaction solvent while distilling off the alcohol ($R^2OH$) resulting from reaction. From the yield standpoint, the reaction is desirably continued to completion while monitoring the reaction by gas chromatography (GC) or thin layer chromatography (TLC), although the reaction time is usually about 1 to about 20 hours. From the reaction mixture, the end amine compound is obtained by a conventional aqueous work-up step. If necessary, the end amine compound is purified by any conventional technique such as distillation, chromatography or recrystallization. Alternatively, the end compound can be collected by directly distilling the reaction mixture.

A third method is synthesis from a cyclic secondary amine compound and an α,β-unsaturated ester compound utilizing Michael addition reaction on amine. This method is especially suited for the preparation of the inventive amine compounds of formula (3).

The α,β-unsaturated ester compounds include acrylates and methacrylates.

An appropriate amount of the α,β-unsaturated ester compound used is 0.5 to 5.0 mol and especially 0.8 to 1.5 mol per mol of the cyclic secondary amine compound. The reaction is carried out in the presence or absence of solvent. Illustrative examples of the solvent include alcohols such as methanol, ethanol, isopropyl alcohol, t-butyl alcohol and ethylene glycol; hydrocarbon solvents such as hexane, heptane, benzene, toluene, and xylene; ethers such as diethyl ether, dibutyl ether, tetrahydrofuran, 1,4-dioxane and diglyme; chlorinated solvents such as methylene chloride, chloroform and 1,2-dichloroethylene; aprotic polar solvents such as N,N-dimethylformamide, N,N-dimethylacet-amide, dimethyl sulfoxide and N-methylpyrrolidone; carboxylic acids such as formic acid and acetic acid; esters such as ethyl acetate and butyl acetate; ketones such as acetone and 2-butanone; nitriles such as acetonitrile; amines such as pyridine and triethylamine; and water. Any appropriate one or mixture may be selected from these solvents depending on the reaction conditions. The reaction temperature is selected in the range from 0° C. to the reflux temperature of the solvent, depending on the desired reaction rate. A catalyst may be added to the reaction system for accelerating the reaction rate. Exemplary catalysts include inorganic acids or salts thereof, such as hydrochloric acid, sulfuric acid and nitric acid, and organic acids or salts thereof, such as p-toluenesulfonic acid, formic acid, acetic acid, oxalic acid and trifluoroacetic acid. Also, a polymerization inhibitor such as hydroquinone, p-methoxyphenol, benzoquinone or phenylenediamine may be added to preclude the α,β-unsaturated ester compound from polymerization. From the yield standpoint, the reaction is desirably continued to completion while monitoring the reaction by gas chromatography (GC) or thin layer chromatography (TLC), although the reaction time is usually about 2 to about 200 hours. The end amine compound is obtained from the reaction mixture directly by vacuum concentration or by a conventional aqueous work-up step and subsequent vacuum concentration. If necessary, the end amine compound thus obtained is purified by any conventional technique such as distillation, chromatography or recrystallization.

A fourth method is synthesis from a cyclic secondary amine compound and a halocarboxylic ester compound utilizing N-alkylation reaction on amine. This method is especially suited for the preparation of the inventive amine compounds of formula (3).

Illustrative, non-limiting examples of the halocarboxylic ester compound include chloroacetic esters, bromoacetic esters, 2-chloropropionic esters, 4-bromobutyric esters and 5-bromovaleric esters. An appropriate amount of the halocarboxylic ester compound used is 0.3 to 10 mol and especially 0.5 to 2.4 mol per mol of the cyclic secondary CD amine compound.

The reaction can be promoted by adding a basic compound. Illustrative, non-limiting examples-of useful basic compounds include amines such as pyridine, CD triethylamine, diisopropylethyl, N,N-dimethylaniline, to 4-dimethylaminopyridine and 1,8-diazabicyclo[5.4.0]-7-undecene; and inorganic bases such as sodium hydroxide, potassium hydroxide, lithium hydroxide, potassium carbonate, sodium carbonate and sodium hydrogen carbonate. The basic compounds may be used alone or in admixture of any. An appropriate amount of the basic compound used is 0.1 to 10 mol and especially 0.8 to 2.0 mol per mol of the halocarboxylic ester compound. A catalyst may also be added to accelerate the reaction, for example, sodium iodide or tetrabutylammonium iodide. An appropriate amount of the catalyst used is 0.001 to 0.5 mol and especially 0.005 to 0.1 mol per mol of the halocarboxylic ester compound. The reaction is carried out in the presence or absence of solvent. Illustrative examples of the solvent include alcohols such as methanol, ethanol, isopropyl alcohol, t-butyl alcohol and ethylene glycol; hydrocarbon solvents such as hexane, heptane, benzene, toluene, and xylene; ethers such as diethyl ether, dibutyl ether, tetrahydrofuran, 1,4-dioxane and diglyme; chlorinated solvents such as methylene chloride, chloroform and 1,2-dichloroethylene; aprotic polar solvents such as N,N-dimethylformamide, N,N-dimethylacet-amide, dimethyl sulfoxide and N-methylpyrrolidone; carboxylic acids such as formic acid and acetic acid; esters such as ethyl acetate and butyl acetate; ketones such as acetone and 2-butanone; nitriles such as acetonitrile; amines such as pyridine and triethylamine; and water. Any appropriate one or mixture may be selected from these solvents depending on the reaction conditions. The reaction temperature is selected in the range from 0C to the reflux temperature of the solvent, depending on the desired (3 reaction rate. From the yield standpoint, the reaction is desirably continued to completion while monitoring the reaction by gas chromatography (GC) or thin layer chromatography (TLC), although the reaction time is usually about 2 to about 200 hours. The end amine compound is obtained from the reaction mixture by filtration or a conventional aqueous work-up step and subsequent vacuum concentration. If necessary, the end amine compound thus obtained is purified by any conventional technique such as distillation, chromatography or recrystallization.

Resist Composition

The resist compositions of the invention contain one or more of the basic compounds of formulae (1), (2), (3) and (4). The amount of the amine compound blended is preferably 0.001 to 2 parts and especially 0.01 to 1 part by weight per 100 parts by weight of the entire base resin to be described later. Less than 0.001 part of the amine compound may fail to achieve the desired effects whereas more than 2 parts may result in a lower sensitivity.

The resist compositions containing the inventive amine compound may be either positive or negative working although they are preferably of the chemical amplification type.

One preferred embodiment of the invention is directed to a positive resist composition comprising (A) the amine compound defined above, (B) an organic solvent, (C) a base resin having an acidic functional group protected with an acid labile group, which is normally alkali insoluble or substantially alkali insoluble, but becomes alkali-soluble upon elimination of the acid labile group, (D) a photoacid generator, and optionally, (E) a dissolution inhibitor.

Another preferred embodiment of the invention is directed to a negative resist composition comprising (A) the amine compound defined above, (B) an organic solvent, (C') a base resin which is normally alkali-soluble, but becomes substantially alkali insoluble when crosslinked with a crosslinker, (D) a photoacid generator, and (F) the crosslinker capable of crosslinking under the action of acid.

Component (B) in the resist composition of the invention is an organic solvent, which may be any organic solvent in which the photoacid generator, base resin, dissolution inhibitor and other components are soluble. Usually 100 to 5,000 parts, and especially 200 to 3,000 parts by weight of the solvent is used per 100 parts by weight of the base resin. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in admixture of two or more. Of the above organic solvents, diethylene glycol dimethyl ether, 1-ethoxy-2-propanol and ethyl lactate in which the photoacid generator is most soluble, propylene glycol monomethyl ether acetate which is a safe solvent, and mixtures thereof are preferred.

Component (C) or (C') is a base resin. For resist compositions adapted for a KrF excimer laser, suitable base resins include polyhydroxystyrene (PHS) and copolymers of PHS with styrene, (meth)acrylates or maleimide-N-carboxylates. For resist compositions adapted for an ArF excimer laser, suitable base resins include (meth)acrylate polymers, alternating copolymers of norbornene and maleic anhydride, alternating copolymers of tetracyclododecene and maleic anhydride, norbornene polymers, and metathesis polymers by ring-opening polymerization. For resist compositions adapted for an $F_2$ excimer laser, suitable base resins include fluorinated ones of the polymers listed for the KrF and ArF applications. These polymers are merely illustrative, and the base resin used herein is not limited thereto. For positive resist compositions, it is a common practice to reduce the dissolution rate of unexposed areas by partially substituting acid labile groups for phenolic hydroxyl groups or carboxyl groups or hydroxyl groups on fluorinated alkyl alcohols.

In the base resin, the acid labile group is selected from a variety of such groups, and preferably from among groups of the following general formulae (8) and (9), tertiary alkyl groups with 4 to 40 carbon atoms of the following general formula (10), trialkylsilyl groups whose alkyl groups each have 1 to 6 carbon atoms, and oxoalkyl groups of 4 to 20 carbon atoms.

In formula (8), $R^{11}$ is a tertiary alkyl group of 4 to 20 carbon atoms, preferably 4 to 15 carbon atoms, a trialkylsilyl group whose alkyl groups each have 1 to 6 carbon atoms, an oxoalkyl group of 4 to 20 carbon atoms or a group of formula (10). Exemplary tertiary alkyl groups are tert-butyl, tert-amyl, 1,1-diethylpropyl, 1-ethylcyclo-pentyl, 1-butylcyclopentyl, 1-ethylcyclohexyl, 1-butylcyclo-hexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter "a1" is an integer of 0 to 6.

In formula (9), $R^{12}$ and $R^{13}$ are independently hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^{14}$ is a monovalent hydrocarbon group of 1 to 18 carbon atoms, preferably 1 to 10 carbon atoms, which may have a hetero atom such as oxygen atom, for example, straight, branched or cyclic alkyl groups, and such groups in which some hydrogen atoms are replaced by hydroxyl, alkoxy, oxo, amino or alkylamino groups. Illustrative examples of the substituted alkyl groups are given below.

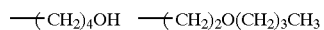

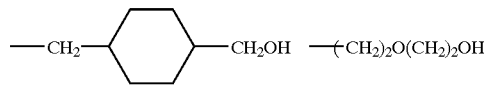

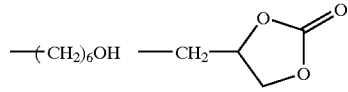

A pair of $R^{12}$ and $R^{13}$, a pair of $R^{12}$ and $R^{14}$, or a pair of $R^{13}$ and $R^{14}$, taken together, may form a ring. Each of $R^{12}$, $R^{13}$ and $R^{14}$ is a straight or branched alkylene group of 1 to 18 carbon atoms, preferably 1 to 10 carbon atoms, when they form a ring.

Illustrative examples of the acid labile groups of formula (8) include tert-butoxycarbonyl, tert-butoxy-carbonylmethyl, tert-amyloxycarbonyl, tert-amyloxycarbonyl-methyl, 1,1-diethylpropyloxycarbonyl, 1,1-diethylpropyloxy-carbonylmethyl, 1-ethylcyclopentyloxycarbonyl, 1-ethylcyclo-pentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Substituent groups of the following formulae (8)-1 through (8)-9 are also included.

Of the acid labile groups of formula (9), straight or branched groups are exemplified by the following formulae (9)-1 through (9)-23.

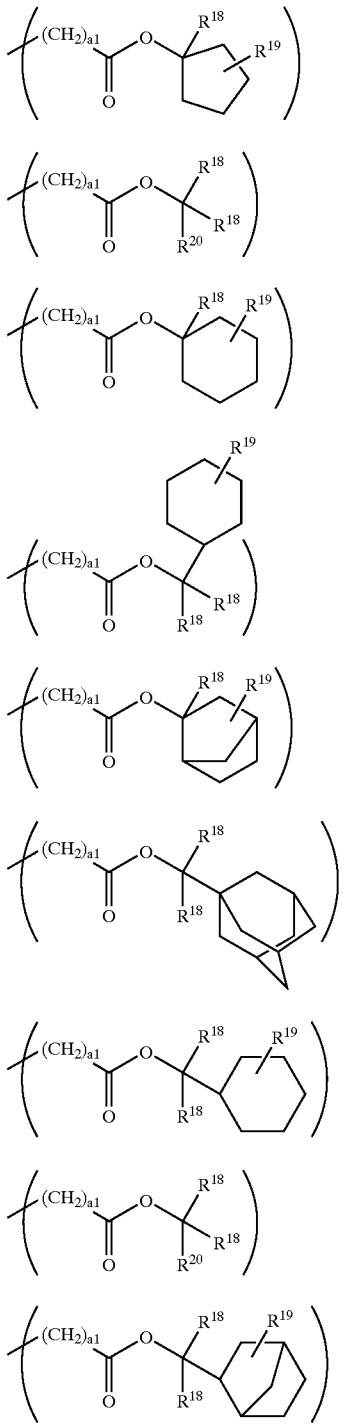

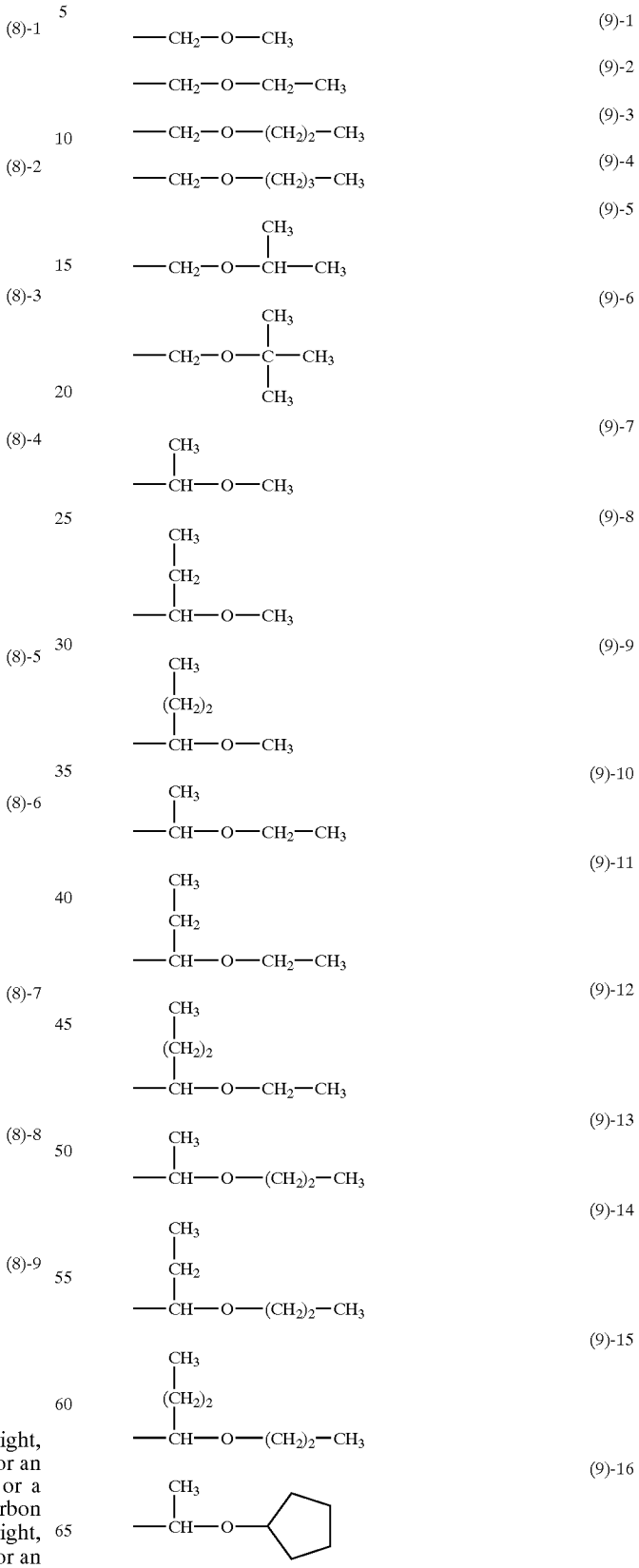

Herein, $R^{18}$ which is identical or different is a straight, branched or cyclic alkyl group of 1 to 10 carbon atoms or an aryl group of 6 to 20 carbon atoms. $R^{19}$ is hydrogen or a straight, branched or cyclic alkyl group of 1 to 10 carbon atoms. $R^{20}$ which is identical or different is a straight, branched or cyclic alkyl group of 2 to 10 carbon atoms or an aryl group of 6 to 20 carbon atoms.

(9)-17 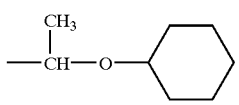

(9)-18 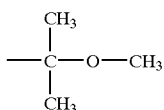

(9)-19 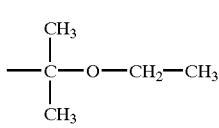

(9)-20 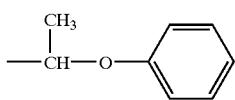

(9)-21 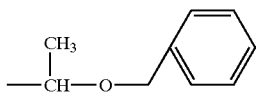

(9)-22 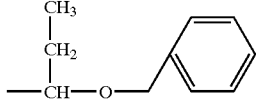

(9)-23 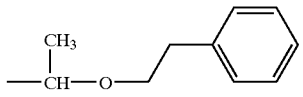

Of the acid labile groups of formula (9), illustrative examples of the cyclic groups include tetrahydrofuran-2-yl, 2-methyltetrahydrofuran-2-yl, tetrahydropyran-2-yl and 2-methyltetrahydropyran-2-yl.

The base resin may be crosslinked within the molecule or between molecules with acid labile groups of the following general formula (9a) or (9b).

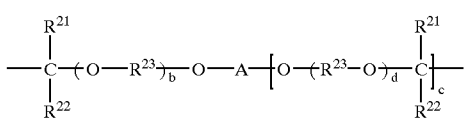 (9a)

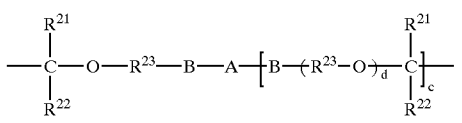 (9b)

Herein $R^{21}$ and $R^{22}$ each are hydrogen or a straight, branched or cyclic alkyl group of 1 to 8 carbon atoms, or $R^{21}$ and $R^{22}$, taken together, may form a ring, and $R^{21}$ and $R^{22}$ are straight or branched alkylene groups of 1 to 8 carbon atoms when they form a ring; $R^{23}$ is a straight, branched or cyclic alkylene group of 1 to 10 carbon atoms; "b" and "d" are 0 or integers of 1 to 10, and preferably 0 or an integer of 1 to 5; "c" is an integer of 1 to 7; "A" is a (c+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The letter "c" is preferably an integer of 1 to 3.

The crosslinking acetal groups of formulae (9a) and (9b) are exemplified by the following formulae (9)-24 through (9)-35.

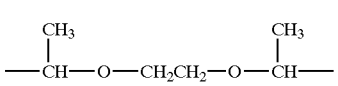 (9)-24

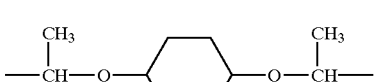 (9)-25

 (9)-26

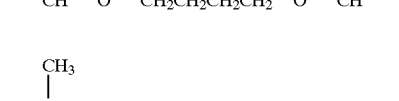 (9)-27

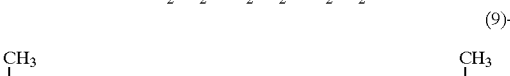 (9)-28

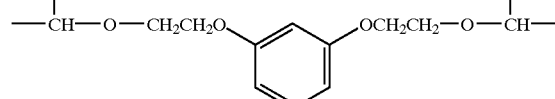 (9)-29

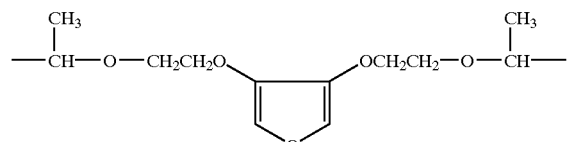 (9)-30

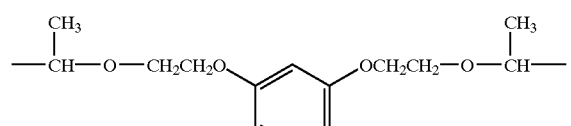

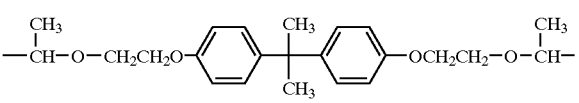 (9)-31

Next, in formula (10), $R^{15}$, $R^{16}$ and $R^{17}$ each are a monovalent hydrocarbon group, typically a straight, branched or cyclic alkyl group of 1 to 20 carbon atoms, which may contain a hetero atom such as oxygen, sulfur, nitrogen or fluorine. A pair of $R^{15}$ and $R^{16}$, $R^{15}$ and $R^{17}$, and $R^{16}$ and $R^{17}$, taken together, may form a ring of 3 to 20 carbon atoms with the carbon atom.

Examples of the tertiary alkyl group represented by formula (10) include tert-butyl, triethylcarbyl, 1-ethyl-norbornyl, 1-methylcyclohexyl, 1-ethylcyclopentyl, 2-(2-methyl)adamantyl, 2-(2-ethyl)adamantyl, and tert-amyl.

Other illustrative examples of the tertiary alkyl group are given below as formulae (10)-1 through (10)-18.
(10)-1
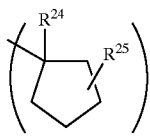
(10)-2
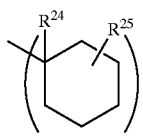
(10)-3
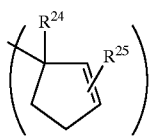
(10)-4
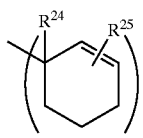
(10)-5
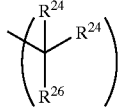
(10)-6
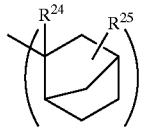
(10)-7
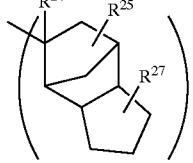
(10)-8
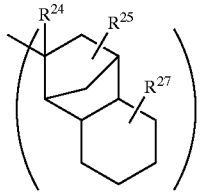
(10)-9
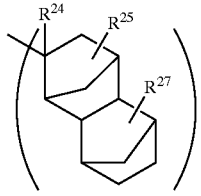
(10)-10
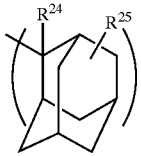
(10)-11
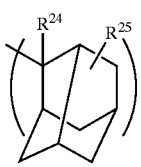
(10)-12
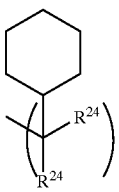
(10)-13
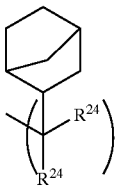
(10)-14
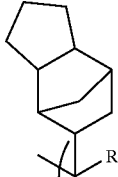
(10)-15
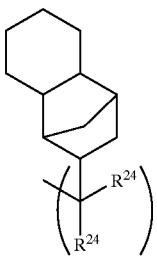
(10)-16
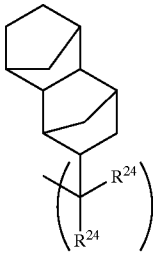

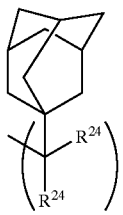

(10)-17

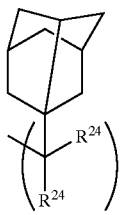

(10)-18

In formulae (10)-1 through (10)-18, $R^{24}$ which may be identical or different is a straight, branched or cyclic alkyl group of 1 to 8 carbon atoms or an aryl group of 6 to 20 carbon atoms, typically phenyl. $R^{25}$ and $R^{27}$ each are hydrogen or a straight, branched or cyclic alkyl group of 1 to 20 carbon atoms. $R^{26}$ is an aryl group of 6 to 20 carbon atoms, typically phenyl.

Further, the polymer may be crosslinked within the molecule or between molecules by incorporating $R^{28}$ which is a divalent or more valent alkylene or arylene group as shown by the following formulae (10)-19 and (10)-20.

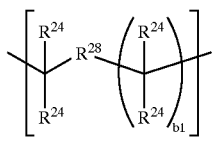

(10)-19

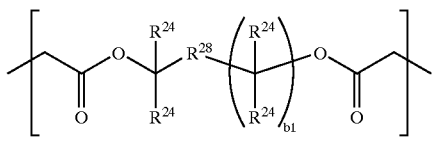

(10)-20

In formulae (10)-19 and (10)-20, $R^{24}$ is as defined above; $R^{28}$ is a straight, branched or cyclic alkylene group of 1 to 20 carbon atoms or an arylene group such as. phenylene, which may contain a hetero atom such as an oxygen, sulfur or nitrogen atom; and b1 is an integer of 1 to 3.

Further, $R^{15}$, $R^{16}$ and $R^{17}$ in formula (10) may have a hetero atom such as oxygen, nitrogen or sulfur. Such groups are exemplified below by formulae (11)-1 through (11)-9.

In formulae (8), (9) and (10), $R^{11}$, $R^{14}$ and $R^{17}$ may also stand for substituted or unsubstituted aryl groups such as phenyl, p-methylphenyl, p-ethylphenyl and alkoxy-substituted phenyl such as p-methoxyphenyl, and aralkyl groups such as benzyl and phenethyl, or alkyl groups of formulae (11)-1 to (11)-5 and oxoalkyl groups of formulae (11)-6 to (11)-9.

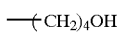

(11)-1

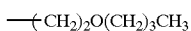

(11)-2

(11)-3

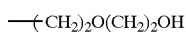

(11)-4

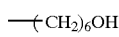

(11)-5

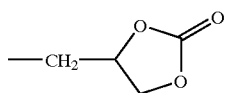

(11)-6

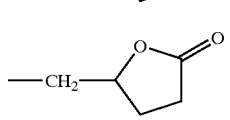

(11)-7

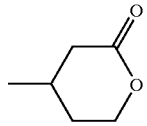

(11)-8

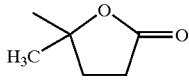

(11)-9

Of the acid labile groups, the trialkylsilyl groups whose alkyl groups each have 1 to 6 carbon atoms include trimethylsilyl, triethylsilyl, and tert-butyldimethylsilyl.

The oxoalkyl groups of 4 to 20 carbon atoms include 3-oxocyclohexyl and groups of the following formulae.

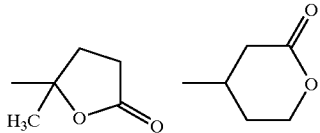

It is noted that the base resin (C) preferably has a weight average molecular weight (Mw) of about 5,000 to about 100,000. A polymer with a Mw of less than 5,000 may have poor film formability and resolution whereas a polymer with a Mw of more than 100,000 may have poor resolution.

Suitable examples of the photoacid generator (D) include onium salts of general formula (12) below, diazomethane derivatives of formula (13), glyoxime derivatives of formula (14), β-ketosulfone derivatives, disulfone derivatives, nitrobenzylsulfonate derivatives, sulfonic acid ester derivatives, and imidoyl sulfonate derivatives.

(12)

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium: $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butyl-phenyl, and dimethylphenyl. Exemplary aralkyl groups include benzyl and phenethyl. Examples of the non-nucleophilic counter-ion represented by K⁻ include halide ions such as chloride and bromide; fluoroalkylsulfonate ions such as triflate, 2,2,2-trifluoroethanesulfonate, and nonafluorobutanesulfonate; arylsulfonate ions such as tosylate, benzenesulfonate, 4-fluorobenzenesulfonate, and 2,3,4,5,6-pentafluorobenzenesulfonate; and alkylsulfonate ions such as mesylate and butanesulfonate.

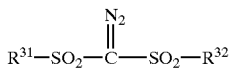
(13)

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluoro-butyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 2,3,4,5,6-pentafluorobenzene. Exemplary aralkyl groups include benzyl and phenethyl.

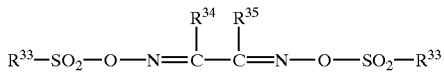
(14)

In the formula, $R^{33}$, $R^{34}$, and $R^{35}$ are straight, branched kD or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups as mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:

onium salts such as diphenyliodonium trifluoromethanesulfonate, (p-tert-butoxyphenyl)phenyliodonium trifluoro-methanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenyl-sulfonium butanesulfonate, trimethylsulfonium trifluoro-methanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethane-sulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)-diazomethane, bis(isoamylsulfonyl)diazomethane, bis(secamylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butyl-sulfonyl)diazomethane;

glyoxime derivatives such as bis-O-(p-toluene-sulfonyl)-α-dimethylglyoxime, bis-O-(p-toluenesulfonyl)-α-diphenylglyoxime, bis-O-(p-toluenesulfonyl)-α-dicyclohexyl-glyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethyl-glyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluoro-benzenesulfonyl)-α-dimethylglyoxime, bis-O-(p-tert-butyl-benzenesulfonyl)-α-dimethylglyoxime, bis-O-(xylenesulfonyl)-α-dimethylglyoxime, and bis-O-(camphorsulfonyl)-α-dimethyl-glyoxime;

β-ketosulfone derivatives such as 2-cyclohexyl-carbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris(methanesulfonyloxy)benzene, 1.2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butyl-sulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazo-methane, bis(p-toluenesulfonyl) diazomethane, bis(cyclohexyl sulfonyl)diazomethane, bis(n-butylsulfonyl)diazomethane, bis(isobutylsulfonyl) diazomethane, bis(sec-butyl-sulfonyl)diazomethane, bis(n-propylsulfonyl)diazomethane, bis(isopropylsulfonyl) diazomethane, and bis(tert-butyl-sulfonyl)diazomethane; and glyoxime derivatives such as bis-O-(p-toluenesulfonyl)-α-dimethylglyoxime and bis-O-(n-butanesulfonyl)-α-dimethylglyoxime; and naphthoquinone-diazidosulfonate derivatives. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 50 parts by weight, and especially about 0.5 to 40 parts by weight, per 100 parts by weight of the entire base resin. At less than 0.2 part, the amount of acid generated during exposure may be too small, resulting in poor sensitivity and resolution. The addition of more than 50parts may lower the transmittance of the resist and result in a poor resolution.

The dissolution inhibitor (E) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxy-phenyl)ethane, 1,1,2-tris(4'-hydroxyphenyl)ethane, phenolphthalein, and thimolphthalein. The acid labile substituents are the same as exemplified for $R^4$.

Illustrative, non-limiting, examples of the dissolution inhibitors which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2''-tetrahydropyranyloxy))propane,
2,2-bis(4'-(2''-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1''-ethoxyethoxy)phenyl)propane,
2,2-bis(4'-(1''-ethoxypropyloxy)phenyl)propane,
tert-butyl 4,4-bis(4'-(2''-tetrahydropyranyloxy)phenyl)-valerate,
tert-butyl 4,4-bis(4'-(2''-tetrahydrofuranyloxy)phenyl)-valerate,
tert-butyl 4,4-bis(4'-tert-butoxyphenyl)valerate,
tert-butyl 4,4-bis(4-tert-butoxycarbonyloxyphenyl) valerate,
tert-butyl 4,4-bis(4'-tert-butoxycarbonylmethyloxyphenyl)-valerate,
tert-butyl 4,4-bis(4'-(1''-ethoxyethoxy)phenyl)valerate,
tert-butyl 4,4-bis(4'-(1''-ethoxypropyloxy)phenyl) valerate,
tris(4-(2'-tetrahydropyranyloxy)phenyl)methane,
tris(4-(2'-tetrahydrofuranyloxy)phenyl)methane.
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2''-tetrahydropyranyloxy)phenyl)ethane.
1,1,2-tris(4'-(2''-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl) ethane,
1,1,2-tris(4'-(1'-ethoxyethoxy)phenyl)ethane, and
1,1,2-tris(4'-(1'-ethoxypropyloxy)phenyl)ethane.

An appropriate amount of the dissolution inhibitor is up to 20 parts, and especially up to 15 parts by weight per 100 parts by weight of the solids in the resist composition. With more than 20 parts of the dissolution inhibitor, the resist composition becomes less heat resistant because of an increased content of monomer components.

Formulated in the negative resist composition is an crosslinker (F) which forms a crosslinked structure under the action of acid. Typical crosslinkers are compounds having at least two hydroxymethyl, alkoxymethyl, epoxy or vinyl ether groups within a molecule. Substituted glycoluril derivatives, urea derivatives, and hexa(methoxy-methyl) melamine compounds are suitable as the crosslinker. Examples include: N,N,N',N'-tetramethoxymethylurea, hexa-methoxymethylmelamine, tetraalkoxymethyl-substituted glycoluril compounds such as tetrahydroxymethyl-substituted glycoluril and tetramethoxymethylglycoluril, and condensates of phenolic compounds such as substituted or unsubstituted bis(hydroxymethylphenol) compounds and bisphenol A with epichlorohydrin. Especially preferred crosslinkers are 1,3,5,7-tetraalkoxymethylglycolurils such as 1,3,5,7-tetramethoxymethylglycoluril, 1,3,5,7-tetrahydroxymethyl-glycoluril, 2,6-dihydroxymethyl-p-cresol, 2,6-dihydroxy-methylphenol, 2,2',6,6'-tetrahydroxymethyl-bisphenol A, 1,4-bis[2-(2-hydroxypropyl)]benzene, N,N,N',N'-tetramethoxy-methylurea, and hexamethoxymethylmelamine. In the resist composition, an appropriate amount of the crosslinker is, though not limited thereto, about 1 to 25 parts, and especially about 5 to 20 parts by weight per 100 parts by weight of the solids in the composition. The crosslinkers may be used alone or in admixture of two or more.

In addition to the inventive basic compound, one or more of commonly used bases may be employed in the inventive resist composition. Examples of suitable conventional basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamlne, diheptylamine, dioctylamine, dinonylamine, didecylamine, didodecylamine, dicetylamine, N,N-dimethyl-methylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamlne, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamlne. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyrldlne derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyrldine, methoxypyridine, butoxypyridine, dimethoxypyridine, 1-methyl-2-pyridine, 4-pyrrolidinopyridine, 1-methyl-4-phenylpyrldine, 2-(1-ethylpropyl)-pyrldine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinoline-carbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-guinolinediol. 3-indolemethanol hydrate, monoethanolamine, diethanolamine, triethanolamine. N-ethyldiethanolamine. N,N-diethylethanolamine, trilsopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxy-ethyl)phthalimide, and N-(2-hydroxyethyl)isonicotinamide. Examples of suitable amide derivatives include formamide, N-methylformamide, N,N-dimethylformamide, acetamide, N-methyl-acetamide, N,N-dimethylacetamide, propionamide, and benzamide. Suitable imide derivatives include phthalimide, succinimide, and maleimide.

In addition, basic compounds of the following general formulas (B)-100 and (B)-101 may also be included.

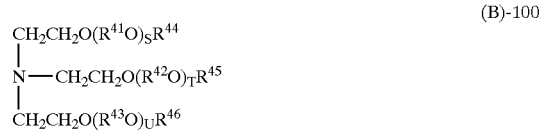

(B)-100

(B)-101

In the formulas, $R^{41}$, $R^{42}$, $R^{43}$ $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms', and may have pendant alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (B)-100 and (B)-101 include tris{2-(methoxymethoxy)-ethyl}amine, tris(2-(methoxyethoxy)ethylamine, tris[2-((2-methoxyethoxy)methoxy}ethyl]amine, tris(2-(2-methoxyethoxy)-ethyl)amine, tris{2-(1-methoxyethoxy)ethyl)amine, tris{2-(1-ethoxyethoxy)ethyl)amine, tris(2-(1-ethoxypropoxy)-ethyl}amine, tris[2-((2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Florade FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd. Also, nonionic surfactants of various hydrocarbon chains may be added for improving the wetting of resist with a developer.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation such as deep-UV rays having a wavelength below 300 nm, an excimer laser, or x-rays in a dose of about 1 to 200 mJ/cm², and preferably about 10 to 100 mJ/cm², then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result In the formation of the desired pattern on the substrate. Of the various types of high-energy radiation that may be used, the resist composition of the invention is best suited to fine pattern formation with, in particular, deep-UV rays having a wavelength of 254 to 120 nm, an excimer laser, especially ArF excimer laser (193 nm), $F_2$ excimer laser (157 nm), $Kr_2$ excimer laser (146 nm), KrAr excimer laser (134 nm) or $Ar_2$ excimer laser (126 nm), soft x-rays of 13 nm, 11 nm and 8 nm, x-rays, or an electron beam. The desired pattern may not be obtainable outside the upper and lower limits of the above range.

The resist composition comprising the amine compound according to the invention is effective for preventing a resist film from thinning and for expanding the focus margin while achieving an improved resolution.

EXAMPLE

Synthesis Examples and Examples are given below for illustrating the invention, but are not to be construed as limiting the invention thereto.

Synthesis Examples

Amine compounds according to the invention were synthesized by the methods described below.

Synthesis Example 1

Synthesis of 1-[2-(methoxymethoxy)ethyl]pyrrolidine

To a mixture of 115 g of 1-(2-hydroxyethyl)-pyrrolidine, 106 g of triethylamine and 500 g of tetrahydrofuran at 0° C. was added 81 g of chloromethyl methyl ether. The temperature was raised from 0° C. to 20° C. over 10 hours whereupon 200 g of water was added to stop the reaction. Ethyl acetate was added to the reaction solution, which was allowed to separate. The organic layer was washed with water and concentrated in vacuum. Purification by vacuum distillation yielded 1-[2-(methoxymethoxy)ethyl]-pyrrolidine, designated [B-1].

Synthesis Example 2

Synthesis of 1-[2-(methoxymethoxy)ethyl]piperidine

By following the same procedure as Synthesis Example 1 except that 1-(2-hydroxyethyl)piperidine was used instead of 1-(2-hydroxyethyl)pyrrolidine. 1-[2-(methoxymethoxy)ethyl]-piperidine, designated [B-2], was synthesized.

Synthesis Example 3

Synthesis of 4-[2-(methoxymethoxy)ethyl]morpholine

By following the same procedure as Synthesis Example 1 except that 4-(2-hydroxyethyl)morpholine was used instead of 1-(2-hydroxyethyl)pyrrolidine, 4-[2-(methoxymethoxy)ethyl]-morpholine, designated [B-3], was synthesized (boiling point: 72° C./133 Pa, yield: 80%).

IR (thin film): ν=2951, 2889, 2854, 2819, 1454, 1299, 1275, 1214, 1147, 1119, 1082, 1070, 1036, 918 cm$^{-1}$ $^1$H-NMR (300 MHz in CDCl$_3$): δ=2.47 (4H, m), 2.57 (2H, t, J=5.7 Hz), 3.33 (3H, s), 3.63 (2H, t, J=5.7 Hz), 4.61 (2H, s)

Synthesis Example 4

Synthesis of 1-[2-[(2-methoxyethoxy)methoxy]ethyl]-pyrrolidine

By following the same procedure as Synthesis Example 1 except that 2-methoxyethoxymethyl chloride was used instead of chloromethyl methyl ether, 1-[2-[(2-methoxyethoxy)-methoxy]ethyl]pyrrolidine, designated [B-4], was synthesized.

Synthesis Example 5

Synthesis of 1-[2-[(2-methoxyethoxy)methoxy]ethyl]piperidine

By following the same procedure as Synthesis Example 2 except that 2-methoxyethoxymethyl chloride was used instead of chloromethyl methyl ether, 1-[2-[(2-methoxyethoxy)-methoxy]ethyl]piperidine, designated [B-5], was synthesized. Synthesis Example 6

Synthesis of 4-[2-[(2-methoxyethoxy)methoxy]ethyl]morpholine

By following the same procedure as Synthesis Example 3 except that 2-methoxyethoxymethyl chloride was used instead of chloromethyl methyl ether, 4-[2-[(2-methoxyethoxy)-methoxy]ethyl]morpholine, designated [B-6], was synthesized (boiling point: 94° C./24 Pa, yield: 75%).

IR (thin film): ν=2929, 2875, 2814, 1454, 1302, 1277, 1119, 1088, 1038 cm$^{-1}$ $^1$H-NMR (300 MHz in CDCl$_3$): δ=2.46 (4H, m), 2.57 (2H, t, J=6.2 Hz), 3.36 (3H, s), 3.52 (2H, m), 3.60–3.75 (8H, m), 4.71 (2H, s)

Synthesis Example 7

Synthesis of 2-(1-pyrrolidinyl)ethyl acetate

By following the same procedure as Synthesis Example 1 except that acetic anhydride was used instead of chloromethyl methyl ether, 2-(1-pyrrolidinyl)ethyl acetate, designated [B-7], was synthesized.

Synthesis Example 8

Synthesis of 2-piperidinoethyl acetate

By following the same procedure as Synthesis Example 2 except that acetic anhydride was used instead of chloromethyl methyl ether, 2-piperidinoethyl acetate, designated [B-81, was synthesized.

Synthesis Example 9

Synthesis of 2-morpholinoethyl acetate

By following the same procedure as Synthesis Example 3 except that acetic anhydride was used instead of chloromethyl methyl ether, 2-morpholinoethyl acetate, designated [B-9], was synthesized (boiling point: 75° C./93 Pa, yield: 97%).

IR (thin film): ν=2958, 2854, 2804, 1740, 1454, 1373, 1232, 1149, 1119, 1038 cm$^{-1}$ $^1$H-NMR (300 MHz in CDCl$_3$): δ=2.03 (3H, s), 2.47 (4H, m), 2.59 (2H, t, J=5.8 Hz), 3.67 (4H, m), 4.17 (2H, t, J=5.8 Hz)

Synthesis Example 10

Synthesis of 2-(1-pyrrolidinyl)ethyl formate

A mixture of 115 9 of 1-(2-hydroxyethyl)pyrrolidine and 500 g of formic acid was heated at 80° C. for 10 hours. The reaction mixture was concentrated in vacuum, diluted with ethyl acetate, and neutralized with saturated sodium bicarbonate in water. This was followed by separation, water washing, drying over anhydrous sodium sulfate, and vacuum concentration. Purification by vacuum distillation yielded 2-(1-pyrrolidinyl)ethyl formate, designated (B-10].

Synthesis Example 11

Synthesis of 2-piperidinoethyl propionate

By following the same procedure as Synthesis Example 2 except that propionic chloride was used instead of chloromethyl methyl ether, 2-piperidinoethyl propionate, designated [B-11], was synthesized.

Synthesis Example 12

Synthesis of 2-morpholinoethyl acetoxyacetate

By following the same procedure as Synthesis Example 3 except that acetoxyacetic chloride was used instead of chloromethyl methyl ether, 2-morpholinoethyl acetoxyacetate, designated [B-12], was synthesized (boiling point: 120° C./60 Pa, yield: 92%).

IR (thin film): ν=2958, 2856, 2808, 1751, c1454, 1423, 1377, 1277, 1240, 1198, 1149, 1119, 1084 cm$^{-1}$ $^1$H-NMR (270 MHz in CDCl$_3$): δ=2.14 (3H, s), 2.47 (4H, m), 2.61 (2H, t, J=5.9 Hz), 3.68 (4H, m), 4.27 (2H, t, J=5.9 Hz), 4.59 (2H, s)

Synthesis Example 13

Synthesis of 2-(1-pyrrolidinyl)ethyl methoxyacetate

By following the same procedure as Synthesis Example 1 except that methoxyacetic chloride was used instead of chloromethyl methyl ether, 2-(1-pyrrolidinyl)ethyl methoxyacetate, designated [B-13], was synthesized.

Synthesis Example 14

Synthesis of 4-[2-(methoxycarbonyloxy)ethyl]morpholine

By following the same procedure as Synthesis Example 3 except that methyl chloroformate was used instead of chloromethyl methyl ether, 4-[2-(methoxycarbonyloxy)-ethyl]morpholine, designated [B-14], was synthesized.

Synthesis Example 15

Synthesis of 1-[2-(t-butoxycarbonyloxy)ethyl]piperidine

By following the same procedure as Synthesis Example 2 except that di-t-butyl pyrocarbonate was used instead of chloromethyl methyl ether, 1-[2-(t-butoxycarbonyloxy)-ethyl]piperidine, designated [B-15], was synthesized.

Synthesis Example 16

Synthesis of 4-[2-(2-methoxyethoxycarbonyloxy)ethyl]-morpholine

By following the same procedure as Synthesis Example 3 except that 2-methoxyethyl chloroformate was used instead of chloromethyl methyl ether, 4-[2-(2-methoxyethoxycarbonyloxy)ethyl]morpholine, designated [B-16], was synthesized.

Synthesis Example 17

Synthesis of methyl 3-(1-pyrrolidinyl)propionate

Pyrrolidine, 71.1 g, was added to 86.1 g of methyl acrylate at 20° C. and reacted for 24 hours. Purification by vacuum distillation yielded 149 g of methyl 3-(1-pyrrolidinyl) propionate, designated [B-17] (boiling point: 74° C./800 Pa, yield: 95%).

IR (thin film): ν=2954, 2789, 1741, 1437, 1354, 1255, 1203, 1176, 1146 cm$^{-1}$ $^1$H-NMR (300 MHz in CDCl$_3$): δ=1.74 (4H, m), 2.40–2.55 (6H, m), 2.74 (2H, m), 3.64 (3H, s)

Synthesis Example 18

Synthesis of methyl 3-peperidinopropionate

By following the same procedure as Synthesis Example 17 except that piperidine was used instead of pyrrolidine, methyl 3-peperidinopropionate, designated [B-18], was synthesized (boiling point: 84° C./800, Pa, yield: 97%).

IR (thin film): ν=2935, 2852, 2775, 1741, 1437, 1379, 1356, 1303, 1221, 1200, 1171, 1155, 1115, 1039, 1001 cm$^{-1}$ $^1$H-NMR (300 MHz in CDCl$_3$): δ=1.39 (2H, m), 1.54 (4H, m), 2.36 (4H, m), 2.48 (2H, m), 2.63 (2H, m), 3.64 (3H, m)

Synthesis Example 19

Synthesis of methyl 3-morpholinopropionate

By following the same procedure as Synthesis Example 17 except that morpholine was used instead of pyrrolidine, methyl 3-morpholinopropionate, designated [B-19], was synthesized (boiling point: 101° C./600 Pa, yield: 98%).

IR (thin film): ν=2954, 2854, 2812, 1740, 1439, 1360, 1298, 1259, 1200, 1119, 1012, 860 cm$^{-1}$ $^1$H-NMR (300 MHz in CDCl$_3$): δ=2.40–2.50 (6H, m), 2.65 (2H, m), 3.60–3.70 (7H, m including 3.65 (3H, s)}

Synthesis Example 20

Synthesis of methyl 3-(thiomorpholino)propionate

By following the same procedure as Synthesis Example 17 except that thiomorpholine was used instead of pyrrolidine, methyl 3-(thiomorpholino)propionate, designated [B-20], was synthesized (boiling point: 70° C./16 Pa, yield: 98%).

IR (thin film): ν=2951, 2912, 2810, 1738, 1462, 1437, 1377, 1348, 1323, 1279, 1205, 1178, 1120, 1063, 1009 cm$^{-1}$ $^1$H-NMR (300 MHz in CDCl$_3$): δ=2.45 (4H, m), 2.60–2.65 (4H, m), 2.65–2.75 (6H, m), 3.65 (3H, s)

Synthesis Example 21

Synthesis of methyl 2-methyl-3-(1-pyrrolidinyl) propionate

By following the same procedure as Synthesis Example 17 except that methyl methacrylate was used instead of methyl acrylate, methyl 2-methyl-3-(1-pyrrolidinyl)-propionate, designated [B-21], was synthesized.

Synthesis Example 22

Synthesis of ethyl 3-morpholinopropionate

By following the same procedure as Synthesis Example 19 except that ethyl acrylate was used instead of methyl acrylate, ethyl 3-morpholinopropionate, designated [B-22], was synthesized (boiling point: 60° C./40 Pa, yield: 98%).

IR (thin film): ν=2958, 2854, 2810, 1734, 1458, 1373, 1298, 1255, 1190, 1119, 1053, 1026 cm$^{-1}$ $^1$H-NMR (300 MHz in CDCl$_3$): δ=1.22 (3H, t, J=7.0 Hz), 2.45–2.50 (6H, m), 2.65 (2H, m), 3.65 (4H, m), 4.11 (2H, q, J=7.0 Hz)

Synthesis Example 23

Synthesis of methoxycarbonylmethyl 3-piperidinopropionate

By following the same procedure as Synthesis Example 18 except that methoxycarbonymethyl acrylate was used instead of methyl acrylate, methoxycarbonylmethyl 3-piperidinopropionate, designated (B-231, was synthesized.

Synthesis Example 24

Synthesis of 2-hydroxyethyl 3-(1-pyrrolidinyl) propionate

By following the same procedure as Synthesis Example 17 except that 2-hydroxyethyl acrylate was used instead of methyl acrylate, 2-hydroxyethyl 3-(1-pyrrolidinyl)-propionate, designated [B-24], was synthesized.

Synthesis Example 25

Synthesis of 2-acetoxyethyl 3-morpholinopropionate

By following the same procedure as Synthesis Example 19 except that 2-acetoxyethyl acrylate was used instead of methyl acrylate, 2-acetoxyethyl 3-morpholinopropionate, designated [B-25], was synthesized (boiling point: 115° C./33 Pa, yield: 95%).

IR (thin film): ν=2958, 2854. 2812, 1740, 1458, 1443, 1375, 1296, 1232, 118.4, 1119, 1059, 1009 cm$^{-1}$ $^1$H-NMR (300 MHz in CDCl$_3$): δ=2.05 (3H, s), 2.42 (4H, m), 2.50 (2H, m), 2.66 (2H, m), 3.66 (4H, m), 4.20–4.30 (4H, m)

Synthesis Example 26

Synthesis of 2-oxotetrahydrofuran-3-yl 3-(1-pyrrolidinyl)-propionate

By following the same procedure as Synthesis Example 17 except that 2-oxotetrahydrofuran-3-yl acrylate was used instead of methyl acrylate, 2-oxotetrahydrofuran-3-yl 3-(1-pyrrolidinyl)propionate, designated [B-26], was synthesized.

Synthesis Example 27

Synthesis of tetrahydrofurfuryl 3-morpholinopropionate

By following the same procedure as Synthesis Example 19 except that tetrahydrofurfuryl acrylate was used instead of methyl acrylate, tetrahydrofurfuryl 3-morpholino-propionate, designated [B-27], was synthesized.(boiling point: 106° C./11 Pa, yield: 80%).

IR (thin film): ν=2954, 2854, 2812, 1736, 1458, 1404, 1360, 1298, 1257, 1186, 1119, 1088, 1072, 1012, 916, 868 cm$^{-1}$ $^1$H-NMR (300 MHz in CDCl$_3$): δ=1.57 (1H, m), 1.80–2.05 (3H, m), 2.42 (4H, m), 2.45–2.55 (2H, m), 2.60–2.70 (2H, m), 3.65 (4H, m), 3.70–3.90 (2H, m), 3.97 (1H, dd, J=11.1, 6.6 Hz), 4.05–4.20 (2H, m)

Synthesis Example 28

Synthesis of glycidyl 3-piperidinopropionate

By following the same procedure as Synthesis Example 18 except that glycidyl acrylate was used instead of methyl acrylate, glycidyl 3-piperidinopropionate, designated [B-28], was synthesized.

Synthesis Example 29

Synthesis of 2-methoxyethyl 3-morpholinopropionate

By following the same procedure as Synthesis Example 19 except that 2-methoxyethyl acrylate was used instead of methyl acrylate, 2-methoxyethyl 3-morpholinopropionate, designated [B-29], was synthesized (boiling point: 93° C./17 Pa, yield: 95%).

IR (thin film): ν=2954, 2893, 2854, 2816, 1738, 1458, 1406, 1375, 1360, 1298, 1257, 1192, 1119, 1059, 1036, 1011 cm$^{-1}$ $^1$H-NMR (300 MHz in CDCl$_3$): δ=2.41 (4H, m), 2.50 (2H, m), 2.65 (2H, m), 3.35 (3H, m), 3.55 (2H, m), 3.65 (2H, m), 4.21 (2H, m)

Synthesis Example 30

Synthesis of 2-(2-methoxyethoxy)ethyl 3-(1-pyrrolidinyl)-propionate

By following the same procedure as Synthesis Example 17 except that 2-(2-methoxyethoxy)ethyl acrylate was used instead of methyl acrylate, 2-(2-methoxyethoxy)ethyl 3-(1-pyrrolidinyl)propionate, designated [B-30], was synthesized.

Synthesis Example 31

Synthesis of butyl 3-morpholinopropionate

By following the same procedure as Synthesis Example 19 except that butyl acrylate was used instead of methyl acrylate, butyl 3-morphollnopropionate, designated [B-31], was synthesized (boiling point: 80° C./40 Pa, yield: 97%).

IR (thin film): ν=2958, 2854, 2810, 1734, 1458, 1360, 1298, 1257, 1188, 1119, 1070, 1011 cm$^{-1}$ $^1$H-NMR (300 MHz in CDCl$_3$): δ=0.90 (3H, t, J=7.4 Hz), 1.35 (2H, m), 1.58 (2H, m), 2.40–2.50 (6H, m), 2.65 (2H, m), 3.66 (4H, m), 4.06 (2H, t, J=6.8 Hz)

Synthesis Example 32

Synthesis of cyclohexyl 3-piperidinopropionate

By following the same procedure as Synthesis Example 18 except that cyclohexyl acrylate was used instead of methyl acrylate, cyclohexyl 3-piperidinopropionate, designated [B-32], was synthesized.

Synthesis Example 33

Synthesis of α-(1-pyrrolidinyl)methyl-γ-butyrolactone

By following the same procedure as Synthesis Example 17 except that α-methylene-γ-butyrolactone was used instead of methyl acrylate, α-(1-pyrrolidinyl)methyl-γ-butyrolactone, designated [B-33], was synthesized.

Synthesis Example 34

Synthesis of β-piperidino-δ-butyrolactone By following the same procedure as Synthesis Example 18 except that 2(5H)-furanone was used instead of methyl acrylate, β-piperidino-γ-butyrolactone, designated [B-34], was synthesized.

Synthesis Example 35

Synthesis of β-morpholino-δ-valerolactone

By following the same procedure as Synthesis Example 19 except that 5,6-dihydro-2H-pyran-2-one was used instead of methyl acrylate and vacuum distillation was omitted, β-morpholino-δ-valerolactone, designated [B-35], was synthesized.

IR (KBr): ν=2958, 2860, 2827, 1726, 1456, 1273, 1236, 1142, 1113, 1074, 885 cm$^{-1}$ $^1$H-NMR (300 MHz in CDCl$_3$): δ=1.81 (1H, m), 2.06 (1H, m), 2.45–2.60 (5H, m), 2.70–2.90 (2H, m), 3.69 (4H, m), 4.19 (1H, ddd, J=11.4, 9.6, 3.6 Hz), 4.42 (1H, dt, J=11.4, 5.0 Hz)

Synthesis Example 36

Synthesis of methyl 1-pyrrolidinylacetate

At 20° C., 76 g of methyl bromoacetate was added to a mixture of 115 g of pyrrolidine and 2,000 g of ethyl acetate, which was stirred for 20 hours. The reaction solution was washed with water, concentrated in vacuum and purified by vacuum distillation, obtaining methyl 1-pyrrolidinylacetate, designated [B-36].

Synthesis Example 37

Synthesis of methyl piperidinoacetate

By following the same procedure as Synthesis Example 36 except that piperidine was used instead of pyrrolidine, methyl piperidinoacetate, designated [B-37], was synthesized.

Synthesis Example 38

Synthesis of methyl morpholinoacetate

By following the same procedure as Synthesis Example 36 except that morpholine was used instead of pyrrolidine, methyl morpholinoacetate, designated [B-38], was synthesized.

Synthesis Example 39

Synthesis of methyl thiomorpholinoacetate

By following the same procedure as Synthesis Example 36 except that thiomorpholine was used instead of ton pyrrolidine, methyl thiomorpholinoacetate, designated [B-39], was synthesized.

Synthesis Example 40

Synthesis of ethyl 1-pyrrolidinylacetate

By following the same procedure as Synthesis Example 36 except that ethyl bromoacetate was used instead of methyl bromoacetate, ethyl 1-pyrrolidlnylacetate, designated [B-40], was synthesized.

Synthesis Example 41

Synthesis of 2-methoxyethyl morpholinoacetate

By following the same procedure as Synthesis Example 39 except that 2-methoxyethyl chloroacetate was used instead of methyl bromoacetate, 2-methoxyethyl morpholinoacetate, designated [B-41], was synthesized.

Synthesis Example 42

Synthesis of 4-[2-(methoxymethoxy)propyl] morpholine

By following the same procedure as Synthesis Example 1 except that 4-(2-hydroxypropyl)morpholine was used instead of 1-(2-hydroxyethyl)pyrrolidine, 4-[2-(methoxymethoxy)propyl]morpholine, designated [B-42], was synthesized (boiling point 67° C./180 Pa, yield: 70%).

IR (thin film): ν=2958, 2933, 2891, 2852, 2816, 1454, 1375, 1294, 1274, 1217, 1149, 1119, 1036, 1014, 918, 866 cm$^{-1}$ $^1$H-NMR (300 MHz in CDCl$_3$): δ=1.14 (2H, d, J=6.3 Hz), 2.22 (1H, dd, J=12.9, 4.7 Hz), 2.45 (4H, m), 2.49 (1H, dd, J=12.9, 7.7 Hz), 3.35 (3H, s), 3.67 (4H, m), 3.87 (1H, ddq, J=7.7, 4.7, 6.3 Hz), 4.65 (1H, d, J=6.9 Hz), 4.68 (1H, d, J=6.9 Hz)

Synthesis Example 43

Synthesis of 4-[2-(tetrahydrofurfurylmethoxy)ethyl]-morpholine

To a suspension of 25 g sodium hydride in 500 g tetrahydrofuran, 131 g of 2-morpholino ethanol and 182 g of tetrahydrofurfuryl bromide were successively added dropwise. Thereafter, 1 9 of sodium iodide was added to the solution, which was heated under reflux for 100 hours. After cooling, the reaction solution was washed with an aqueous saturated sodium chloride solution, concentrated in vacuum, and purified by vacuum distillation, whereby 120 g of 4-[2-(tetrahydrofurfurylmethoxy)ethyl]morpholine, designated [B-43], was obtained (boiling point 97° C./24 Pa, yield: 56%).

IR (thin film): ν=2954, 2856, 2804, 1454, 1302, 1277, 1146, 1119, 1070, 1038 cm-1

$^1$H-NMR (270 MHz in CDCl$_3$): δ=1.56 (1H, m), 1.75–2.00 (3H, m), 2.48 (4H, m), 2.57 (2H, t, J=6.1 Hz), 3.35–3.50 (2H, m), 3.50–3.90 (8H, m), 4.02 (1H, m)

Synthesis Example 44

Synthesis of 4-tetrahydrofurfurylmorpholine

A mixture of 165 g of tetrahydrofurfuryl bromide, 348 g of morpholine, 5 g of sodium iodide and 500 g of tetrahydrofuran was heated under reflux for 50 hours. After cooling, diethyl ether was added to the reaction solution, which was filtered, concentrated in vacuum and purified by vacuum distillation, whereby 158 g of 4-tetrahydrofurfurylmorpholine, designated [B-44], was obtained (boiling point 64° C./15 Pa, yield: 92%).

IR (thin film): ν=2958, 2854, 2808, 1454, 1294, 1144, 1119, 1068, 1035, 1020, 918, 868 cm$^{-1}$ $^1$H-NMR (270 MHz in CDCl$_3$): δ=1.47 (1H, m), 1.75–2.00 (3H, m), 2.36 (1H, dd, J=13.2. 4.1 Hz), 2.45 (1H, dd, J=13.2, 7.8 Hz), 2.49 (4H, m), 3.65–3.75 (5H, m), 3.85 (1H, m), 4.00 (1H, m)

Synthesis Example 45

Synthesis of 4-[(2-[2-(2-methoxyethoxy)ethoxy]ethyl]-morpholine

By following the same procedure as Synthesis Example 44 except that 2-[2-(2-methoxyethoxy)ethoxy]ethyl p-toluenesulfonate was used instead of tetrahydrofurfuryl bromide, 4-[2-[2-(2-methoxyethoxy)ethoxy]ethyl]morpholine, designated [B-45], was synthesized (boiling point 110° C./80 Pa, yield: 82%).

IR (thin film): ν=2858, 2812, 1454, 1352, 1302, 1279, 1200, 1119, 1038, 1011, 947, 858 cm$^{-1}$ $^1$H-NMR (270 MHz in CDCl$_3$): δ=2.47 (4H, m), 2.56 (2H, t, J=5.8 Hz), 3.35 (3H, s), 3.50–3.55 (2H, m), 3.55–3.65 (8H, m), 3.68 (4H, m)

Synthesis Example 46

Synthesis of 4-[2-[2-[2-(2-methoxyethoxy)ethoxy]ethoxy]-ethyl]morpholine

By following the same procedure as Synthesis Example 44 except that 2-[2-[2-(2-methoxyethoxy)ethoxy]ethoxy]ethyl p-toluenesulfonate was used instead of tetrahydrofurfuryl bromide, 4-[2-[2-[2-(2-methoxyethoxy)ethoxy]ethoxy]ethyl]-morpholine, designated [B-46], was synthesized (boiling point 125° C./9.3 Pa, yield: 80%).

IR (thin film): ν=2864, 2813, 1454, 1352, 1302, 1119, 1038, 947, 858 cm$^{-1}$ $^1$H-NMR (270 MHz in CDCl$_3$): δ=2.47 (4H, m), 2.56 (2H, t, J=5.8 Hz), 3.53 (3H, s), 3.50–3.65 (14H, m), 3.69 (4H, m)

Synthesis Example 47

Synthesis of 2-morpholinoethyl butyrate

By following the same procedure as Synthesis Example 3 except that butyric chloride was used instead of chloromethyl methyl ether, 2-morpholinoethyl butyrate, designated [B-47], was synthesized (boiling point 88° C./43 Pa, yield: 92%).

IR (thin film): ν=2962, 2856, 2805, 1736, 1456, 1381, 1356, 1302, 1282. 1254, 1176, 1149, 1119, 1070 cm$^{-1}$ $^1$H-NMR (300 MHz in CDCl$_3$): δ=0.92 (3H, t, J=7.4 Hz), 1.62 (2H, tq, J=7.4, 7.4 Hz), 2.27 (2H, t, J=7.4 Hz), 2.47 (4H, m), 2.59 (2H, t, J=5.9 Hz), 3.67 (4H, m), 4.18 (2H, t, J=5.9 Hz)

Synthesis Example 48

Synthesis of 2-morpholinoethyl pivalate

By following the same procedure as Synthesis Example 3 except that pivalic chloride was used instead of chloromethyl methyl ether, 2-morpholinoethyl pivalate, designated [B-48], was synthesized (boiling point 83° C./51 Pa, yield: 93%).

IR (thin film): ν=2960, 2854, 2806, 1730, 1481, 1456, 1396, 1365, 1284, 1155, 1119, 1036, 1012, 943, 860 cm$^{-1}$ $^1$H-NMR (270 MHz in CDCl$_3$): δ=1.18 (9H, s), 2.48 (4H, m), 2.59 (2H, t, J=5.8 Hz), 3.67 (4H, m), 4.18 (2H, t, J=5.8 Hz)

Synthesis Example 49

Synthesis of 2-morpholinoethyl hexanoate

By following the same procedure as Synthesis Example 3 except that hexanoic chloride was used instead of chloromethyl methyl ether, 2-morpholinoethyl hexanoate, designated [B-49], was synthesized (boiling point 105° C./93 Pa, yield: 94).

IR (thin film): ν=2958, 2933, 2856, 2805, 1738, 1456, 1300, 1279, 1246, 1170. 1119, 1036, 1012 cm$^{-1}$ $^1$H-NMR (270 MHz in CDCl$_3$): δ=0.87 (3H, m), 1.29 (4H, m), 1.60 (2H, m), 2.29 (2H, t, J=7.3 Hz), 2.48 (4H, m), 2.60 (2H, t, J=5.8 Hz), 3.68 (4H, m), 4.18 (2H, t, J=5.8, Hz)

Synthesis Example 50

Synthesis of 2-morpholinoethyl methoxyacetate

By following the same procedure as Synthesis Example 3 except that methoxyacetic chloride was used instead of chloromethyl methyl ether, 2-morpholinoethyl methoxyacetate, designated [B-50, was synthesized (boiling point 91° C./33 Pa, yield: 94%).

IR (thin film): ν=2956, 2854, 2821, 1755, 1454, 1282, 1194, 1119, 1031, 937, 916 cm$^{-1}$ $^1$H-NMR (270 MHz in CDCl$_3$): δ=2.47 (4H, m), 2.61 (2H, t, J=30 5.8 Hz), 3.43 (3H, s), 3.67 (4H, m), 4.02 (2H, s), 4.27 (2H, t, J=5.8 Hz)

Synthesis Example 51

Synthesis of 2-morpholinoethyl 2-methoxyethoxyacetate

By following the same procedure as Synthesis Example 3 except that 2-methoxyethoxyacetic chloride was used instead of chloromethyl methyl ether, 2-morpholinoethyl 2-methoxy-ethoxyacetate, designated [B-51], was synthesized (boiling point 122° C./16 Pa, yield: 90%).

IR (thin film): ν=2956, 2890, 2856, 2815, 1755, 1456, 1282, 1200, 1147, 1119, 1034, 1012, 858 cm$^{-1}$ $^1$H-NMR (270 MHz in CDCl$_3$): δ=2.46 (4H, m), 2.60 (2H, t, J=5.9 Hz), 3.35 (3H, s), 3.50–3.60 (2H, m), 3.60–3.70 (6H, m), 4.13 (2H, 9), 4.25 (2H, t, J=5.9 Hz)

Synthesis Example 52

Synthesis of 1-(morpholinomethyl)ethyl acetate

By following the same procedure as Synthesis Example 7 except that 4-(2-hydroxypropyl)morpholine was used instead to of 4-(2-hydroxyethyl)morpholine, 1-(morpholinomethyl)ethyl acetate, designated [B-52], was synthesized (boiling point 56° C./37 Pa, yield: 94%).

IR (thin film): ν=2960, 2935, 2854, 2810, 1736, 1456, 1373, 1295, 1277, 1242, 1119, 1063, 1014, 863 cm$^{-1}$ $^{hu}$ $_1$H-NMR (270 MHz in CDCl$_3$): δ=2.20 (3H, d, J=6.5 Hz), 2.02 (3H, s), 2.30 (1H, dd, J=12.7, 4.9 Hz), 2.35–2.55 (5H, m), 3.65 (4H, t, J=4.6 Hz), 5.07 (1H, m)

Synthesis Example 53

Synthesis of 1-(morpholinomethyl)ethyl butyrate

By following the same procedure as Synthesis Example 52 except that butyric chloride was used instead of acetic anhydride, 1-(morpholinomethyl)ethyl butyrate, designated (B-53], was synthesized (boiling point 68° C./27 Pa, yield: 80%).

IR (thin film): ν=2964, 2935, 2854, 2810, 1734, 1456, 1377, 1298, 1277, 1255, 1186, 1119, 1063, 1014, 864 cm$^{-1}$ $^1$H-NMR (300 MHz in CDCl$_3$): δ=0.93 (3H, t, J=7.4 Hz), 1.19 (3H, d, J=6.3 Hz), 1.63 (2H, tq, J=7.4, 7.4 Hz), 2.24 (2H, t, J=7.4 Hz), 2.25–2.55 (6H, m), 3.64 (4H, t, J=4.7 Hz), 5.10 (1H, m)

Synthesis Example 54

Synthesis of 1-(morpholinomethyl)pentyl acetate

By following the same procedure as Synthesis Example 52 except that 4-(2-hydroxyhexyl)morpholine was used instead of 4-(2-hydroxypropyl)morpholine, 1-(morpholinomethyl)pentyl acetate, designated [B-54], was synthesized (boiling point 70° C./15 Pa, yield: 97%).

IR (thin film): ν=2958, 2933, 2856, 2807, 1736, 1456, 1373, 1240, 1119, 1036, 1022, 868 cm$^{-1}$ $^1$H-NMR (300 MHz in CDCl$_3$): δ=0.87 (3H, m), 1.20–1.35 (4H, m), 1.52 (2H, m), 2.03 (3H, 8), 2.25–2.60 (6H, m), 3.64 (4H, m), 5.02 (1H, m)

Synthesis Example 55

Synthesis of 2-(2-methoxyethoxy)ethyl 3-morpholinopropionate

By following the same procedure as Synthesis Example except that 2-(2-methoxyethoxy)ethyl acrylate was used instead of methyl acrylate, 2-(2-methoxyethoxy)ethyl 3-morpholinopropionate, designated [B-55], was synthesized (boiling point 122° C./27 Pa, yield: 90%).

IR (thin film): ν=2953, 2856, 2814, 1736, 1458, 1377, 1358, 1298, 1257, 1196, 1119, 1070, 1061, 1036, 1011, 858 cm$^{-1}$ $^1$H-NMR (300 MHz in CDCl$_3$): δ=2.43 (4H, m), 2.51 (2H, m), 2.66 (2H, m), 3.35 (3H, s), 3.50–3.55 (2H, m), 3.55–3.65 (2H, m), 3.65–3.70 (6H, m), 4.22 (2H, m)

Synthesis Example 56

Synthesis of 2-butoxyethyl 3-morpholinopropionate

By following the same procedure as Synthesis Example 19 except that 2-butoxyethyl acrylate was used instead of methyl acrylate, 2-butoxyethyl 3-morpholinopropionate, designated [B-56], was synthesized (boiling point 118° C./20 Pa, yield: 904).

IR (thin film): ν=2958, 2858, 2811, 1738, 1458, 1379, 1358, 1298, 1257, 1188, 1119, 1070, 1061, 1036, 1011 cm$^{-1}$ $^1$H-NMR (300 MHz in CDCl$_3$): δ=0.89 (3H, to J=7.4 Hz), 1.33 (2H, m). 1.53 (2H, m), 2.43 (4H, m), 2.51 (2H, m), 2.67 (2H, m), 3.43 (2H, t, J=6.6 Hz), 3.58 (2H, m), 3.66 (4H, m), 4.20 (2H, m)

Synthesis Example 57

Synthesis of ethyl 4-morpholinobutyrate

By following the same procedure as Synthesis Example 39 except that ethyl bromoacetate was used instead of methyl chloroacetate, ethyl 4-morpholinobutyrate, designated [B-57], was synthesized (boiling point 72° C./53 Pa, yield: 88%).

IR (thin film): ν=2958, 2854, 2808, 1734, 1458, 1446, 1371, 1300, 1277, 1250, 1184, 1140, 1119, 1070, 1032, 1011 cm$^{-1}$ $^1$H-NMR (300 MHz in CDCl$_3$): δ=1.23 (3H, t, J=7.2 Hz), 1.78 (2H, tt, J=7.2, 7.2 Hz), 2.31 (2H, t, J=7.2 Hz), 2.32 (2H, t, J=7.2 Hz), 2.40 (4H, m), 3.67 (4H, m), 4.10 (2H, q, J=7.2 Hz)

Synthesis Example 58

Synthesis of 3-morpholinopropylene diacetate

By following the same procedure as Synthesis Example 9 except that 3-morpholino-1,2-propane diol was used instead of 4-(2-hydroxyethyl)morpholine, 3-morpholinopropylene diacetate, designated [B-58], was synthesized (boiling point 117° C./16 Pa, yield: 80%).

IR (thin film): ν=2960, 2854, 2810, 1743, 1456, 1371, 1225, 1119, 1047, 1012 cm$^{-1}$ $^1$H-NMR (270 MHz in CDCl$_3$): δ=2.04 (3H, 8), 2.05 (3H, s), 2.40–2.55 (6H, m), 3.64 (4H, m), 4.09 (1H, dd, J=12.0, 6.6 Hz), 4.34 (1H, dd, J=12.0, 3.1 Hz), 5.19 (1H, m)

Synthesis Example 59

Synthesis of 4-[2,3-bis(methoxymethoxy)propyl] morpholine

By following the same procedure as Synthesis Example 58 except that methoxymethyl chloride was used instead of acetic anhydride, 4-[2.3-bis(methoxymethoxy)propyl]-morpholine, designated [B-59], was synthesized (boiling point 97° C./35 Pa, yield: 77%).

IR (thin film): ν=2935, 2889, 2852, 2821, 1456, 1292, 1275, 1213, 1149. 1119, 1036, 918. 866 cm$^{-1}$ $^1$H-NMR (270 MHz in CDCl$_3$): δ=2.40–2.60 (6H, m), 3.35 (3H, s), 3.39 (3H, s), 3.55–3.70 (6H, m), 3.88 (1H, m), 4.62 (2H, s), 4.71 (1H, d. J=6.8 Hz), 4.74 (1H, d. J=6.8 Hz)

Synthesis Example 60

Synthesis of 4-[2,3-bis[(2-methoxyethoxy) methoxy]-propyl]morpholine

By following the same procedure as Synthesis Example 58 except that (2-methoxyethoxy)methyl chloride was used instead of acetic anhydride, 4-[2,3-bis[(2-methoxy-ethoxy) methoxy]propyl]morpholine, designated [B-60], was synthesized (boiling point 172° C./35 Pa, yield: 70%).

IR (thin film): ν=2931, 2885, 2816, 1456, 1365, 1294, 1243, 1200, 1119, 1039, 985, 866 cm$^{-1}$ $^1$H-NMR (270 MHz in CDCl$_3$): δ=2.40–2.55 (6H, m), 3.36 (3H, s), 3.52 (4H, m), 3.55–3.80 (10H, m), 3.92 (1H, m), 4.70 (2H, s), 4.79 (1H, d, J=7.1 Hz), 4.82 (1H, d, J=7.1 Hz)

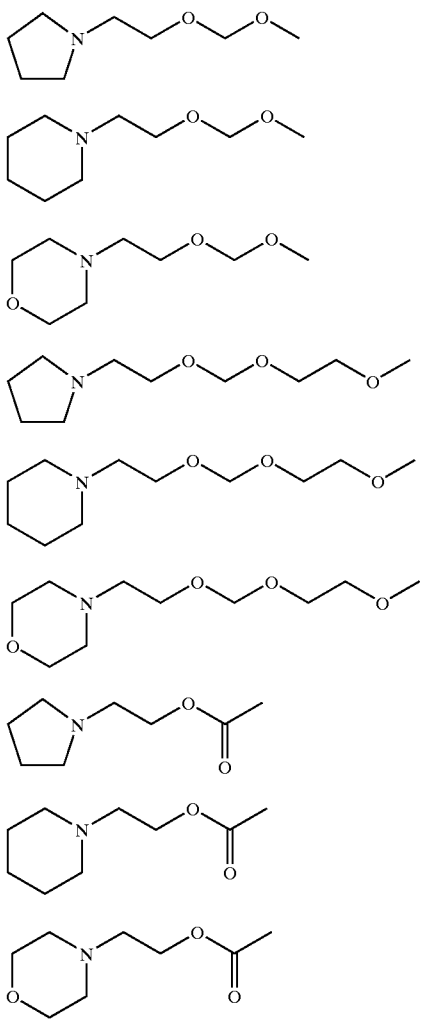

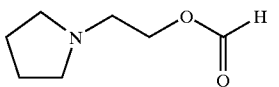
B-10

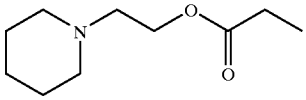
B-11

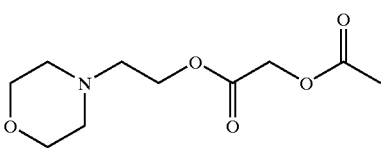
B-12

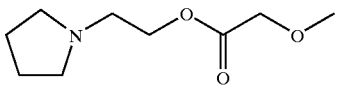
B-13

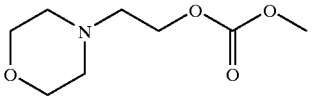
B-14

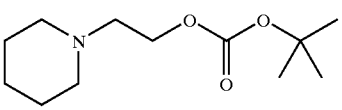
B-15

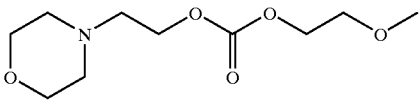
B-16

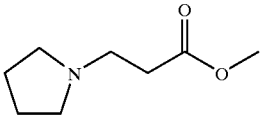
B-17

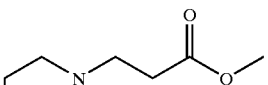
B-18

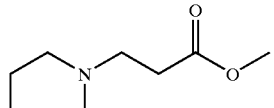
B-19

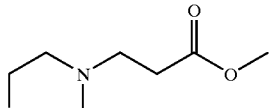
B-20

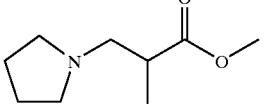
B-21

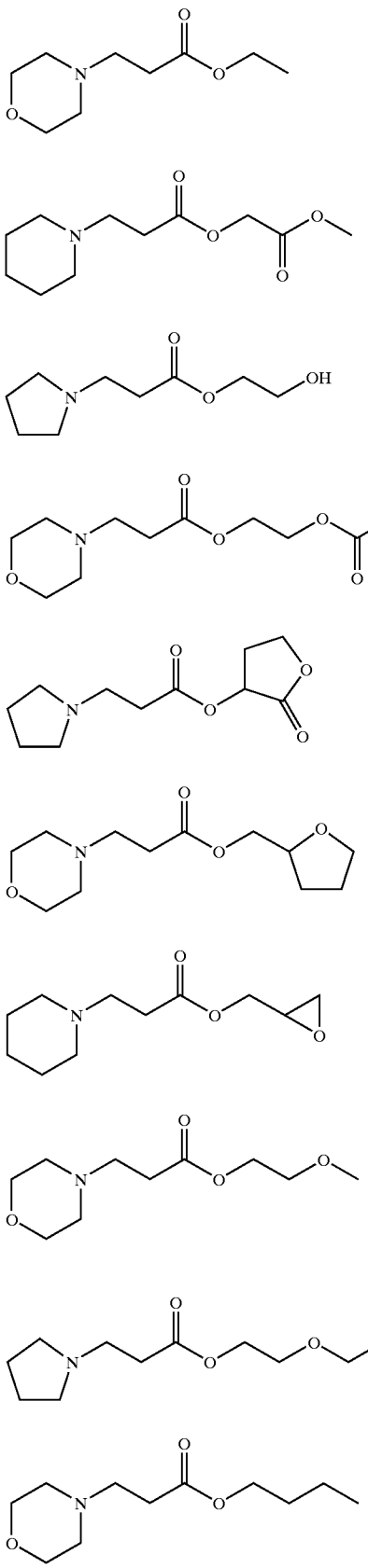
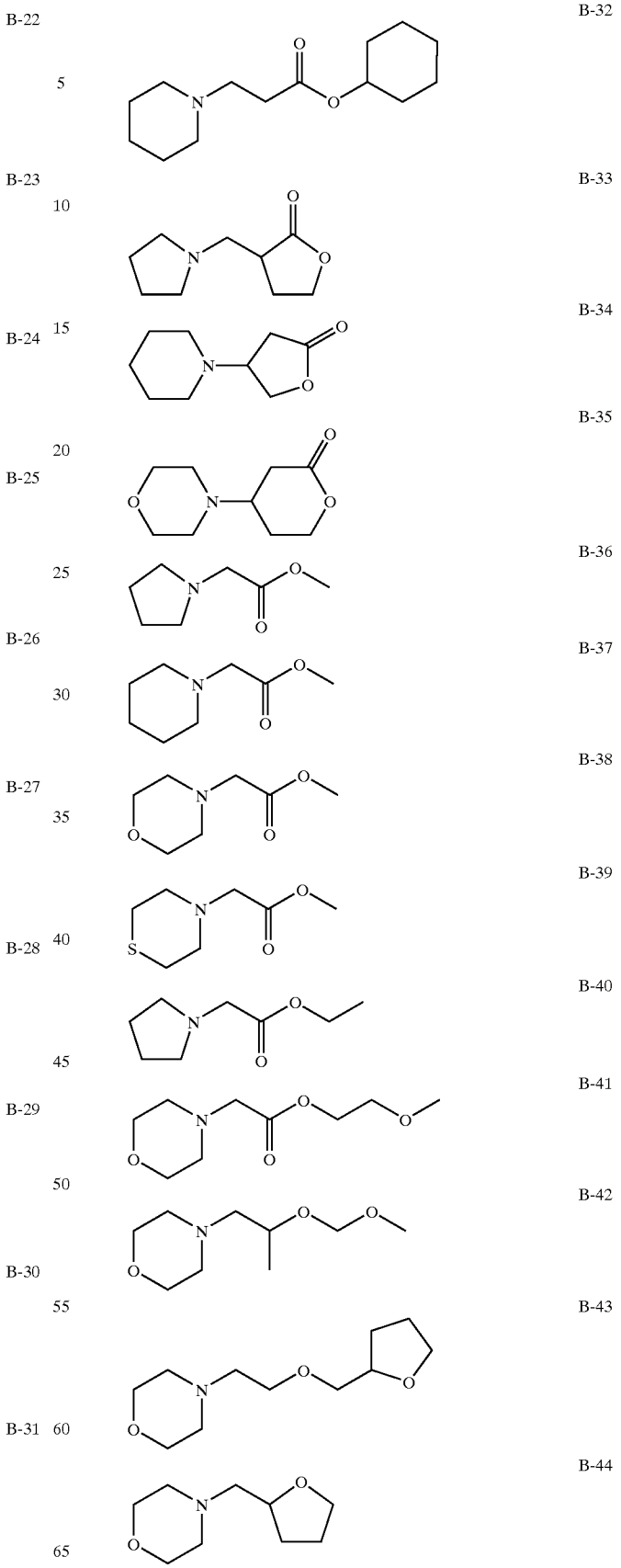

-continued

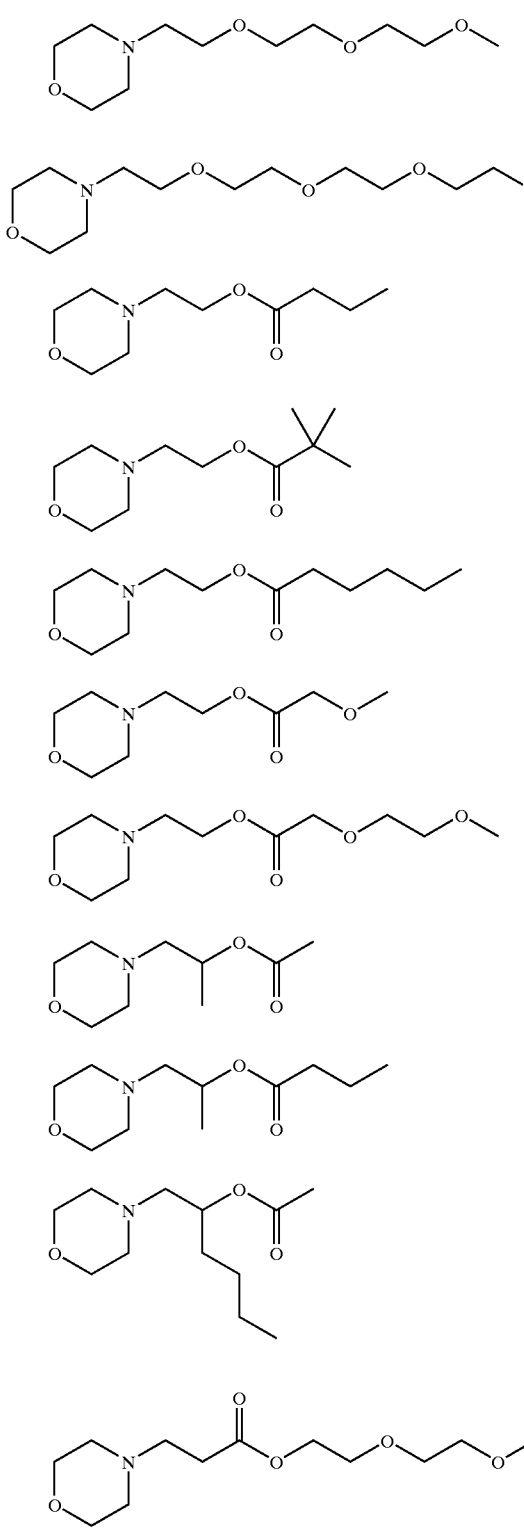

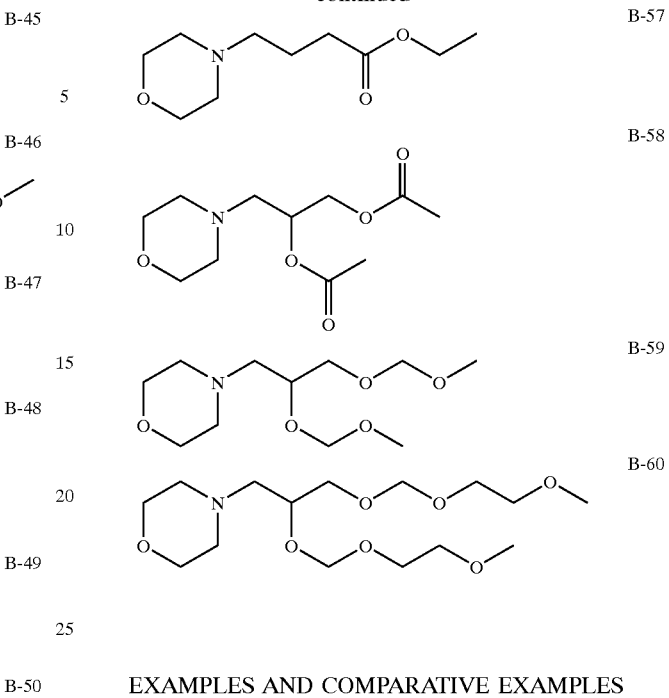

EXAMPLES AND COMPARATIVE EXAMPLES

Resist solutions were prepared by dissolving the amine compound (B-1 through B-41) synthesized above or another go basic compound, polymer (Polymers i to 10 shown below), photoacid generator (PAG1 to 5), dissolution inhibitor (DRI) and crosslinker, all identified below, in a solvent mixture of propylene glycol monomethyl ether acetate (PGMEA) and ethyl lactate (EL) in a 70:30 ratio in the amounts shown in Tables 1 to 3 and passing through a Teflon® filter having a pore size of 0.1 μm.

On silicon wafers, DUV-30 (Nissan Chemical Industries Ltd.) was coated to form films of 55 nm thick so that the reflectance to KrF light (248 nm) was reduced below 1%. On the coated substrates, the resist solutions were spin coated, then baked on a hot plate at 100° C. for 90 seconds to give resist films having a thickness of 550 nm.

The resist films were exposed by means of an excimer laser stepper (NSR-S202A from Nikon Corporation; NA 0.6, σ 0.75, ⅔ annular zone illumination) while the exposure dose and focus were varied. Immediately after exposure, the resist films were baked at 110° C. for 90 seconds and then developed for 60 seconds with a 2.38% aqueous solution of tetramethylammonium hydroxide, thereby giving patterns.

The resulting resist patterns were evaluated as described below. The results are also shown in Tables 1 to 3.

Evaluation:

The exposure dose providing a 1:1 resolution at the top and bottom of a 0.16-μm line-and-space pattern was the optimum exposure dose (sensitivity Eop). A focus margin at the optimum exposure dose was determined. The definition of focus margin is that the pattern film experiences no thinning and the size falls within 0.16 μm±10%.

Polymer 1
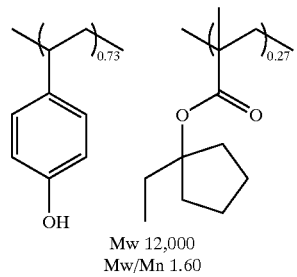
Mw 12,000
Mw/Mn 1.60
Polymer 2
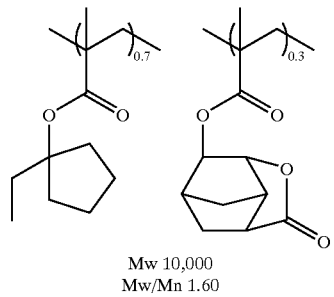
Mw 10,000
Mw/Mn 1.60
Polymer 3
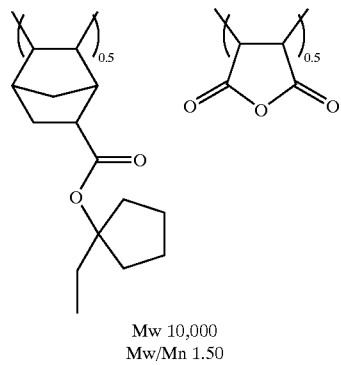
Mw 10,000
Mw/Mn 1.50
Polymer 4
Polymer 5
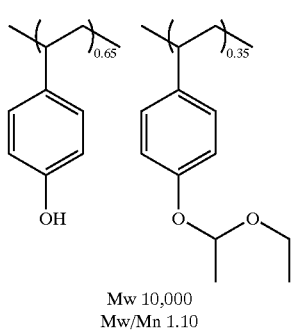
Mw 10,000
Mw/Mn 1.10
Polymer 6
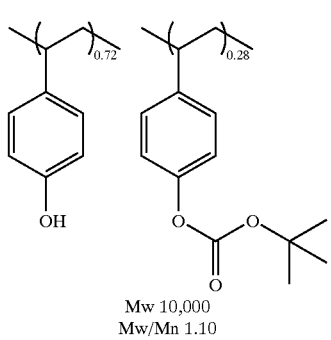
Mw 10,000
Mw/Mn 1.10
Polymer 7
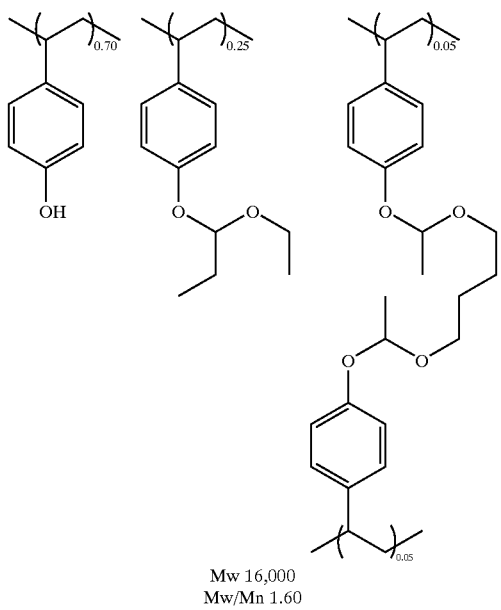
Mw 16,000
Mw/Mn 1.60
Polymer 8
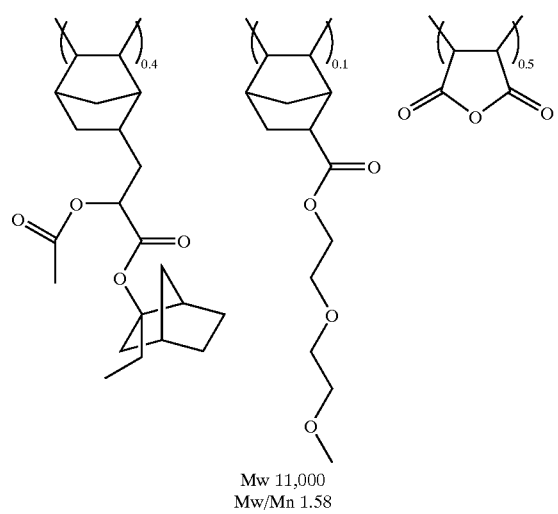
Mw 11,000
Mw/Mn 1.58
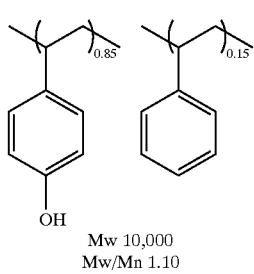
Mw 10,000
Mw/Mn 1.10

Polymer 9

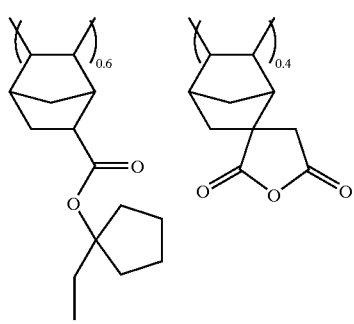

Mw 18,000
Mw/Mn 2.0

Polymer 10

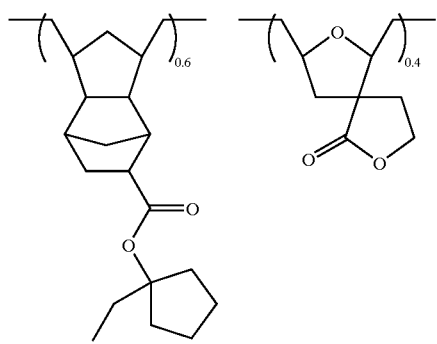

Mw 13,000
Mw/Mn 1.20

PAG 1

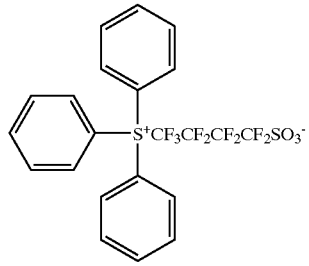

PAG 2

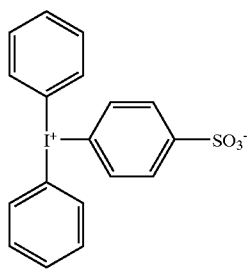

PAG 3

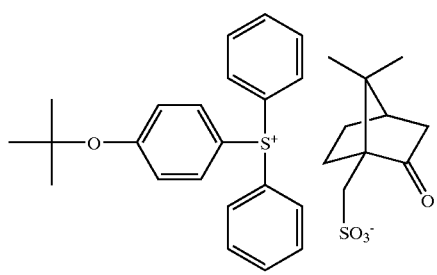

PAG 4

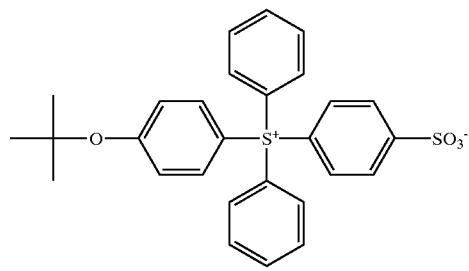

PAG 5

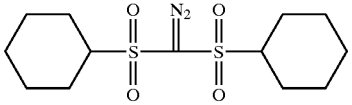

DRI

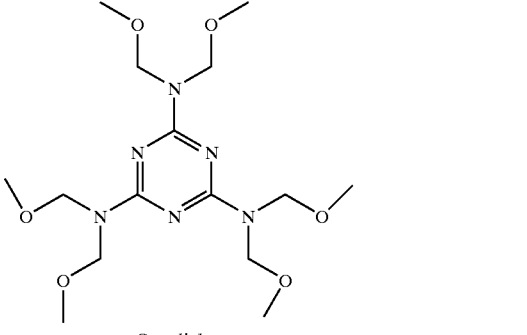

Crosslinker

TABLE 1

| Polymer (pbw) | Photoacid generator (pbw) | Basic compound (pbw) | Dissolution inhibitor/ crosslinker (pbw) | Sensitivity (mJ/cm$^2$) | Focus margin (μm) |
|---|---|---|---|---|---|
| Polymer 5 (100) | PAG 3 (2) | B-1 (0.1) | — | 30 | 0.8 |
| Polymer 5 (100) | PAG 3 (2) | B-2 (0.1) | — | 35 | 0.8 |
| Polymer 5 (100) | PAG 3 (2) | B-3 (0.1) | — | 31 | 1.1 |
| Polymer 5 (100) | PAG 3 (2) | B-4 (0.13) | — | 30 | 0.8 |
| Polymer 5 (100) | PAG 3 (2) | B-5 (0.13) | — | 29 | 0.9 |
| Polymer 5 (100) | PAG 3 (2) | B-6 (0.14) | — | 28 | 1.1 |
| Polymer 5 (100) | PAG 3 (2) | B-7 (0.1) | — | 32 | 1.0 |
| Polymer 5 (100) | PAG 3 (2) | B-8 (0.12) | — | 39 | 1.0 |
| Polymer 5 (100) | PAG 3 (2) | B-9 (0.11) | — | 38 | 1.1 |
| Polymer 5 (100) | PAG 3 (2) | B-10 (0.09) | — | 39 | 1.0 |
| Polymer 5 (100) | PAG 3 (2) | B-11 (0.12) | — | 41 | 0.9 |
| Polymer 5 (100) | PAG 3 (2) | B-12 (0.15) | — | 42 | 1.1 |
| Polymer 5 (100) | PAG 3 (2) | B-13 (0.12) | — | 39 | 1.0 |

TABLE 1-continued

| Polymer (pbw) | Photoacid generator (pbw) | Basic compound (pbw) | Dissolution inhibitor/ crosslinker (pbw) | Sensitivity (mJ/cm$^2$) | Focus margin ($\mu$m) |
|---|---|---|---|---|---|
| Polymer 5 (100) | PAG 3 (2) | B-14 (0.12) | — | 41 | 1.2 |
| Polymer 5 (100) | PAG 3 (2) | B-15 (0.14) | — | 40 | 0.9 |
| Polymer 5 (100) | PAG 3 (2) | B-16 (0.14) | — | 41 | 1.1 |
| Polymer 5 (100) | PAG 3 (2) | B-17 (0.1) | — | 40 | 1.0 |
| Polymer 5 (100) | PAG 3 (2) | B-18 (0.11) | — | 39 | 1.0 |
| Polymer 5 (100) | PAG 3 (2) | B-19 (0.12) | — | 38 | 1.2 |
| Polymer 5 (100) | PAG 3 (2) | B-20 (0.12) | — | 41 | 1.0 |
| Polymer 5 (100) | PAG 3 (2) | B-21 (0.16) | — | 40 | 1.0 |
| Polymer 5 (100) | PAG 3 (2) | B-22 (0.12) | — | 37 | 1.1 |
| Polymer 5 (100) | PAG 3 (2) | B-23 (0.14) | — | 38 | 1.0 |
| Polymer 5 (100) | PAG 3 (2) | B-24 (0.12) | — | 37 | 0.9 |
| Polymer 5 (100) | PAG 3 (2) | B-25 (0.15) | — | 40 | 1.1 |
| Polymer 5 (100) | PAG 3 (2) | B-26 (0.14) | — | 39 | 1.0 |
| Polymer 5 (100) | PAG 3 (2) | B-27 (0.15) | — | 41 | 1.2 |

TABLE 2

| Polymer (pbw) | Photoacid generator (pbw) | Basic compound (pbw) | Dissolution inhibitor/ crosslinker (pbw) | Sensitivity (mJ/cm$^2$) | Focus margin ($\mu$m) |
|---|---|---|---|---|---|
| Polymer 5 (100) | PAG 3 (2) | B-28 (0.13) | — | 37 | 0.9 |
| Polymer 5 (100) | PAG 3 (2) | B-29 (0.14) | — | 41 | 1.1 |
| Polymer 5 (100) | PAG 3 (2) | B-30 (0.15) | — | 41 | 1.0 |
| Polymer 5 (100) | PAG 3 (2) | B-31 (0.14) | — | 37 | 1.1 |
| Polymer 5 (100) | PAG 3 (2) | B-32 (0.15) | — | 35 | 0.8 |
| Polymer 5 (100) | PAG 3 (2) | B-33 (0.11) | — | 38 | 1.0 |
| Polymer 5 (100) | PAG 3 (2) | B-34 (0.11) | — | 34 | 0.8 |
| Polymer 5 (100) | PAG 3 (2) | B-35 (0.12) | — | 38 | 1.0 |
| Polymer 5 (100) | PAG 3 (2) | B-36 (0.09) | — | 35 | 0.8 |
| Polymer 5 (100) | PAG 3 (2) | B-37 (0.1) | — | 36 | 0.9 |
| Polymer 5 (100) | PAG 3 (2) | B-38 (0.1) | — | 40 | 1.0 |
| Polymer 5 (100) | PAG 3 (2) | B-39 (0.11) | — | 41 | 1.0 |
| Polymer 5 (100) | PAG 3 (2) | B-40 (0.1) | — | 38 | 0.9 |
| Polymer 5 (100) | PAG 3 (2) | B-41 (0.13) | — | 41 | 1.1 |
| Polymer 1 (100) | PAG 5 (2) | B-19 (0.12) | — | 45 | 0.9 |
| Polymer 2 (100) | PAG 5 (2) | B-19 (0.12) | — | 50 | 0.9 |
| Polymer 3 (100) | PAG 5 (2) | B-19 (0.12) | — | 48 | 1.1 |
| Polymer 3 (100) | PAG 4 (2) | B-19 (0.12) | — | 48 | 1.0 |
| Polymer 4 (100) | PAG 2 (2) | B-19 (0.12) | Crosslinker (15) | 33 | 0.8 |
| Polymer 6 (100) | PAG 1 (2) | B-19 (0.12) | — | 46 | 1.0 |
| Polymer 7 (100) | PAG 1 (2) | B-19 (0.12) | — | 48 | 1.0 |
| Polymer 8 (100) | PAG 1 (2) | B-19 (0.12) | — | 42 | 1.0 |
| Polymer 9 (100) | PAC 1 (2) | B-19 (0.12) | — | 40 | 0.8 |
| Polymer 10 (100) | PAG 1 (2) | B-19 (0.12) | — | 46 | 0.8 |
| Polymer 5 (100) | PAG 2 (2) | B-19 (0.12) | DRI (20) | 31 | 1.0 |

TABLE 3

| Polymer (pbw) | Photoacid generator (pbw) | Basic compound (pbw) | Dissolution inhibitor/ crosslinker (pbw) | Sensitivity (mJ/cm$^2$) | Focus margin ($\mu$m) |
|---|---|---|---|---|---|
| Polymer 5 (100) | PAG 2 (2) | — | — | 8 | 0.2 |
| Polymer 5 (100) | PAG 2 (2) | proton sponge (0.2) | — | 35 | 0.4 |
| Polymer 5 (100) | PAG 2 (2) | DBN (0.1) | — | 34 | 0.4 |
| Polymer 5 (100) | PAG 2 (2) | DBU (0.1) | — | 32 | 0.5 |
| Polymer 1 (100) | PAG 5 (2) | DBN (0.1) | — | 52 | 0.2 |
| Polymer 2 (100) | PAG 5 (2) | DBN (0.1) | — | 62 | 0.5 |
| Polymer 3 (160) | PAG 5 (2) | DBN (0.1) | — | 51 | 0.3 |
| Polymer 3 (100) | PAG 4 (2) | DBN (0.1) | — | 51 | 0.2 |
| Polymer 4 (100) | PAG 2 (2) | DBN (0.1) | Crosslinker (15) | 33 | 0.3 |
| Polymer 6 (100) | PAG 1 (2) | DBN (0.1) | — | 46 | 0.6 |
| Polymer 7 (100) | PAG 1 (2) | DBN (0.1) | — | 48 | 0.6 |
| Polymer 8 (100) | PAG 1 (2) | DBN (0.1) | — | 42 | 0.6 |
| Polymer 9 (100) | PAG 1 (2) | DBN (0.1) | — | 45 | 0.4 |
| Polymer 10 (100) | PAG 1 (2) | DBN (0.1) | — | 48 | 0.3 |
| Polymer 5 (100) | PAG 2 (2) | DBN (0.1) | DRI (20) | 29 | 0.3 |

Japanese Patent Application No. 2000-362800 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An amine compound of the following formula (I'):

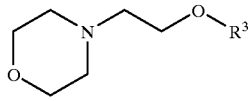
(I')

wherein $R^3$ is hydrogen or a straight, branched or cyclic alkyl group of 1 to 20 carbon atoms which optionally contains one or more hydroxy groups, ether groups, carbonyl groups, ester groups, lactone rings or carbonate groups.

2. An amine compound of the following formula (II'):

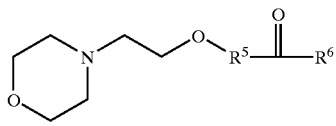
(II')

wherein $R^5$ is a single bond or a straight, branched or cyclic alkylene group of 1 to 20 carbon atoms, and $R^6$ is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups.

3. An amine compound of the following formula (3):

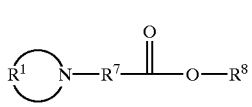
(3)

wherein $R^1$ is a straight or branched alkylene group of 2 to 20 carbon atoms which optionally contains at least one carbonyl, ether, ester or sulfide group, $R^7$ is a straight or branched alkylene group of 1 to 10 carbon atoms, $R^8$ is a straight, branched or cyclic alkyl group of 1 to 20 carbon atoms which optionally contains one or more hydroxy groups, ether groups, carbonyl groups, ester groups, lactone rings or carbonate groups, and $R^7$ and $R^8$, taken together, optionally form a ring with the COO.

4. An amine compound according to claim 3, wherein the moiety (A) is a moiety of one of formulae (A)-1 to (A)-12,

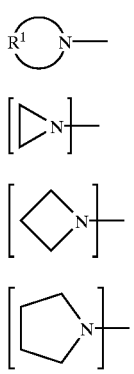

(A)

(A)-1

(A)-2

(A)-3

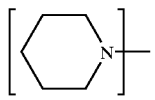
(A)-4

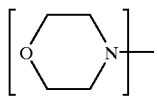
(A)-5

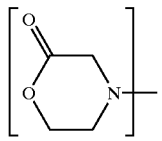
(A)-6

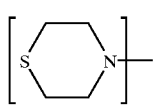
(A)-7

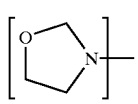
(A)-8

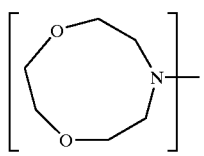
(A)-9

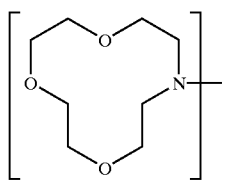
(A)-10

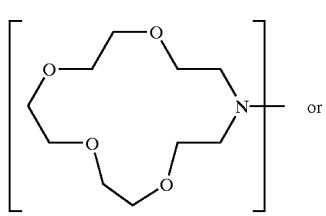
(A)-11 or

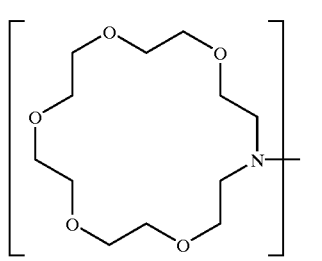
(A)-12

5. A resist composition comprising an amine compound of claim 4.

6. A resist composition comprising at least one amine compound of the following formulae (1) to (4):

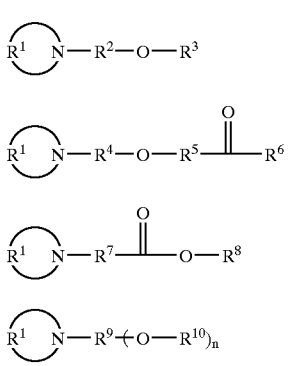

wherein $R^1$ is a straight or branched alkylene group of 2 to 20 carbon atoms which optionally contains at least one carbonyl, ether, ester or sulfide group, $R^2$, $R^4$ and $R^7$ each are a straight or branched alkylene group of 1 to 10 carbon atoms, $R^3$ and $R^6$ are, each independently, hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, $R^5$ is a single bond or a straight, branched or cyclic alkylene group of 1 to 20 carbon atoms, $R^8$ is a straight, branched or cyclic alkyl group of 1 to 20 carbon atoms which optionally contains one or more hydroxy groups, ether groups, carbonyl groups, ester groups, lactone rings or carbonate groups, $R^2$ and $R^3$, taken together, optionally form a ring with the oxygen atom, $R^7$ and $R^8$, taken together, optionally form a ring with the COO, $R^9$ is a (n+1)-valent organic group of 2 to 10 carbon atoms, $R^{10}$ which is the same or different is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, and n is equal to 2, 3 or 4.

7. A process for forming a resist pattern comprising the steps of:

applying the resist composition of claim 6 onto a substrate to form a coating, heat treating the coating and then exposing it to high-energy radiation having a wavelength of less than 300 nm or electron beams through a photo mask, and optionally heat treating the exposed coating and developing it with a developer.

8. A resist composition according to claim 6, comprising an amine compound of the following formula (I'):

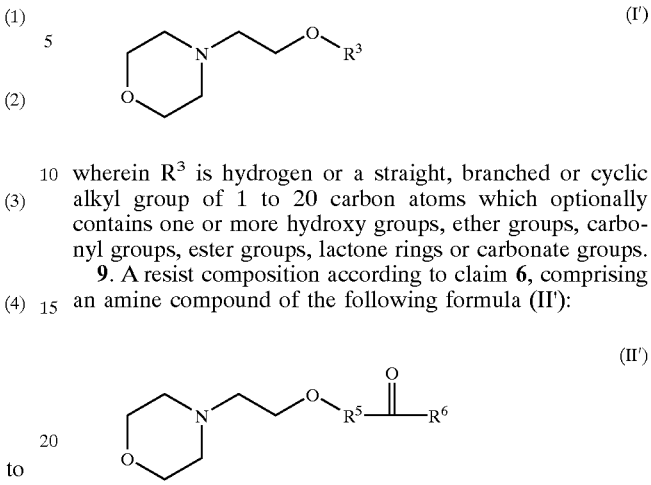

wherein $R^3$ is hydrogen or a straight, branched or cyclic alkyl group of 1 to 20 carbon atoms which optionally contains one or more hydroxy groups, ether groups, carbonyl groups, ester groups, lactone rings or carbonate groups.

9. A resist composition according to claim 6, comprising an amine compound of the following formula (II'):

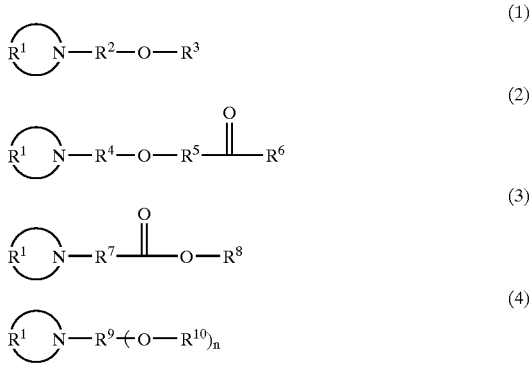

wherein $R^5$ is a single bond or a straight, branched or cyclic alkylene group of 1 to 20 carbon atoms, and $R^6$ is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups.

10. A resist composition according to claim 6, comprising an amine compound of formula (3).

11. A positive resist composition comprising (A) at least one amine compound of the following formulae (1) to (4):

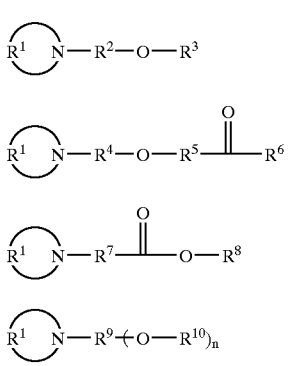

wherein $R^1$ is a straight or branched alkylene group of 2 to 20 carbon atoms which optionally contains at least one carbonyl, ether, ester or sulfide group, $R^2$, $R^4$ and $R^7$ each are a straight or branched alkylene group of 1 to 10 carbon atoms, $R^3$ and $R^6$ are, each independently, hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, $R^5$ is a single bond or a straight, branched or cyclic alkylene group of 1 to 20 carbon atoms, $R^8$ is a straight, branched or cyclic alkyl group of 1 to 20 carbon atoms which optionally contains one or more hydroxy groups, ether groups, carbonyl groups, ester groups, lactone rings or carbonate groups, R² and R³, taken together, optionally form a ring with the oxygen atom, R⁷ and R⁸, taken together, optionally form a ring with the COO, R⁹ is a (n+1)-valent organic group of 2 to 10 carbon atoms, R¹⁰ which is the same or different is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, and n is equal to 2, 3 or 4, (B) an organic solvent, (C) a base resin having an acidic functional group protected with an acid labile group, which is normally alkali insoluble or substantially alkali insoluble, but becomes alkali soluble upon elimination of the acid labile group, and (D) a photoacid generator.

12. The positive resist composition of claim 11 further comprising (E) a dissolution inhibitor.

13. A process for forming a resist pattern comprising the steps of:

applying the resist composition of claim 11 onto a substrate to form a coating, heat treating the coating and then exposing it to high-energy radiation having a wavelength of less than 300 nm or electron beams through a photo mask, and optionally heat treating the exposed coating and developing it with a developer.

14. A positive resist composition according to claim 6, comprising an amine compound of the following formula (I'):

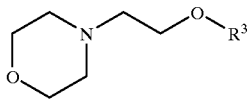

(I')

wherein R³ is hydrogen or a straight, branched or cyclic alkyl group of 1 to 20 carbon atoms which optionally contains one or more hydroxy groups, ether groups, carbonyl groups, ester groups, lactone rings or carbonate groups.

15. A positive resist composition according to claim 11, comprising an amine compound of the following formula (II'):

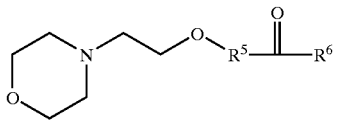

(II')

wherein R⁵ is a single bond or a straight, branched or cyclic alkylene group of 1 to 20 carbon atoms, and R⁶ is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups.

16. A positive resist composition according to claim 11, comprising an amine compound of formula (3).

17. A negative resist composition comprising (A) at least one amine compound of the following formulae (1) to (4):

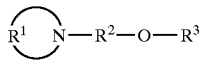

(1)

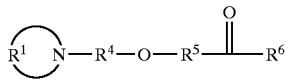

(2)

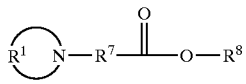

(3)

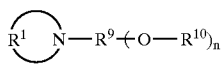

(4)

wherein R¹ is a straight or branched alkylene group of 2 to 20 carbon atoms which optionally contains at least one carbonyl, ether, ester or sulfide group, R², R⁴ and R⁷ each are a straight or branched alkylene group of 1 to 10 carbon atoms, R³ and R⁶ are, each independently, hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, R⁵ is a single bond or a straight, branched or cyclic alkylene group of 1 to 20 carbon atoms, R⁸ is a straight, branched or cyclic alkyl group of 1 to 20 carbon atoms which optionally contains one or more hydroxy groups, ether groups, carbonyl groups, ester groups, lactone rings or carbonate groups, R² and R³, taken together, optionally form a ring with the oxygen atom, R⁷ and R⁸, taken together, optionally form a ring with the COO, R⁹ is a (n+1)-valent organic group of 2 to 10 carbon atoms, R¹⁰ which is the same or different is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups, and n is equal to 2, 3 or 4, (B) an organic solvent, (C') a base resin which is normally alkali-soluble, but becomes substantially alkali insoluble when crosslinked with a crosslinker, (D) a photoacid generator, and (F) the crosslinker capable of crosslinking under the action of acid.

18. A negative resist composition according to claim 17, comprising an amine compound of the following formula (I'):

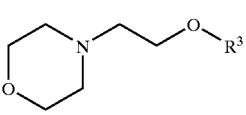

(I')

wherein R³ is hydrogen or a straight, branched or cyclic alkyl group of 1 to 20 carbon atoms which optionally contains one or more hydroxy groups, ether groups, carbonyl groups, ester groups, lactone rings or carbonate groups.

19. A negative resist composition according to claim 17, comprising an amine compound of the following formula (II'):

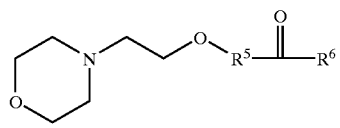 (II')

wherein $R^5$ is a single bond or a straight, branched or cyclic alkylene group of 1 to 20 carbon atoms, and $R^6$ is hydrogen or a straight, branched or cyclic alkyl or alkoxy group of 1 to 20 carbon atoms which optionally contains one or more hydroxy groups, ether groups, carbonyl groups, ester groups, lactone rings or carbonate groups.

20. A negative resist composition according to claim 17, comprising an amine compound of formula (3).

* * * * *